United States Patent
Sanada

(10) Patent No.: US 11,495,311 B2
(45) Date of Patent: Nov. 8, 2022

(54) NON-VOLATILE MEMORY WITH ERASE VERIFY SKIP

(71) Applicant: SANDISK TECHNOLOGIES LLC, Addison, TX (US)

(72) Inventor: Kazuhiko Sanada, Kanagawa (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/359,208

(22) Filed: Jun. 25, 2021

(65) Prior Publication Data
US 2021/0327518 A1   Oct. 21, 2021

Related U.S. Application Data

(62) Division of application No. 16/704,428, filed on Dec. 5, 2019, now Pat. No. 11,081,196.

(51) Int. Cl.
| | |
|---|---|
| *G11C 16/04* | (2006.01) |
| *G11C 16/34* | (2006.01) |
| *H01L 27/11565* | (2017.01) |
| *H01L 27/11582* | (2017.01) |
| *G11C 16/16* | (2006.01) |

(52) U.S. Cl.
CPC ...... *G11C 16/3445* (2013.01); *G11C 16/0483* (2013.01); *G11C 16/16* (2013.01); *H01L 27/11565* (2013.01); *H01L 27/11582* (2013.01)

(58) Field of Classification Search
CPC .................................................. G11C 16/0483
USPC ...................................................... 365/185.17
See application file for complete search history.

(56) References Cited

U.S. PATENT DOCUMENTS

| | | | |
|---|---|---|---|
| 6,009,014 A | 12/1999 | Hollmer | |
| 6,381,174 B1* | 4/2002 | Roohparvar | G11C 29/82 365/185.09 |
| 9,330,778 B2 | 5/2016 | Costa | |
| 9,355,737 B2 | 5/2016 | Shirakawa | |
| 9,672,931 B2 | 6/2017 | Yoon | |
| 10,381,095 B1 | 8/2019 | Date | |
| 10,741,253 B1 | 8/2020 | Lu | |

(Continued)

OTHER PUBLICATIONS

Office Action dated Jan. 8, 2021, U.S. Appl. No. 16/704,428.

(Continued)

*Primary Examiner* — Hoai V Ho
(74) *Attorney, Agent, or Firm* — Vierra Magen Marcus LLP

(57) ABSTRACT

A non-volatile storage apparatus is configured to perform erase verify during an erase process in order to account for differences in erase speed. In order to reduce the time used to perform the erase process (which includes the erase verify), the erase verify operation is skipped for certain memory cells based on a system parameter. For example, when erasing a block of memory cells, a series of erase voltage pulses are applied to the NAND strings in outer sub-blocks and inner sub-blocks of the block. Erase verify is performed between erase voltage pulses for NAND strings in the outer sub-blocks while skipping erase verify for NAND strings in the inner sub-blocks. Performing erase verify between erase voltage pulses for NAND strings in the inner sub-blocks is started at a predetermined number of erase voltage pulses after the NAND strings in the outer sub-blocks successfully erase verify.

20 Claims, 19 Drawing Sheets

(56) References Cited

U.S. PATENT DOCUMENTS

| | | | |
|---|---|---|---|
| 10,861,559 B1 * | 12/2020 | Desai | G11C 16/08 |
| 10,923,197 B2 | 2/2021 | Lu | |
| 2015/0221388 A1 | 8/2015 | Lee | |
| 2018/0342304 A1 | 11/2018 | Dunga | |

OTHER PUBLICATIONS

Response to Office Action dated Mar. 3, 2021, U.S. Appl. No. 16/704,428.

Notice of Allowance dated Jun. 11, 2021, U.S. Appl. No. 16/704,428.

* cited by examiner

Figure 4D
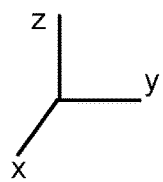
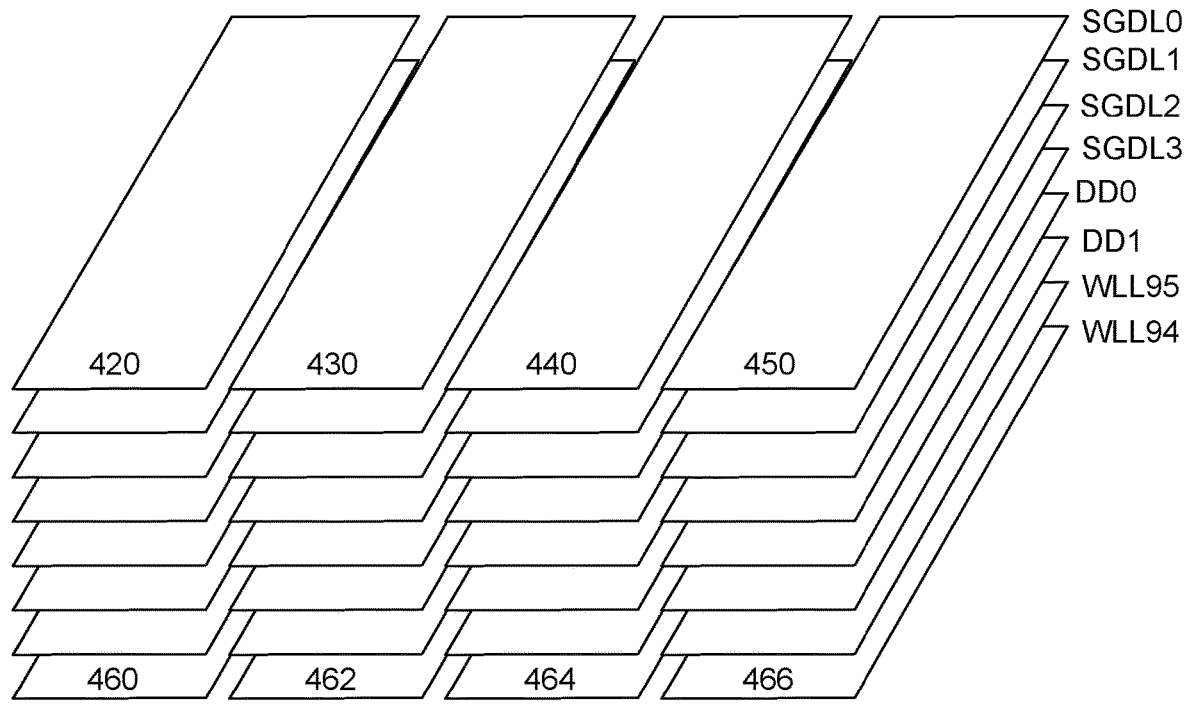
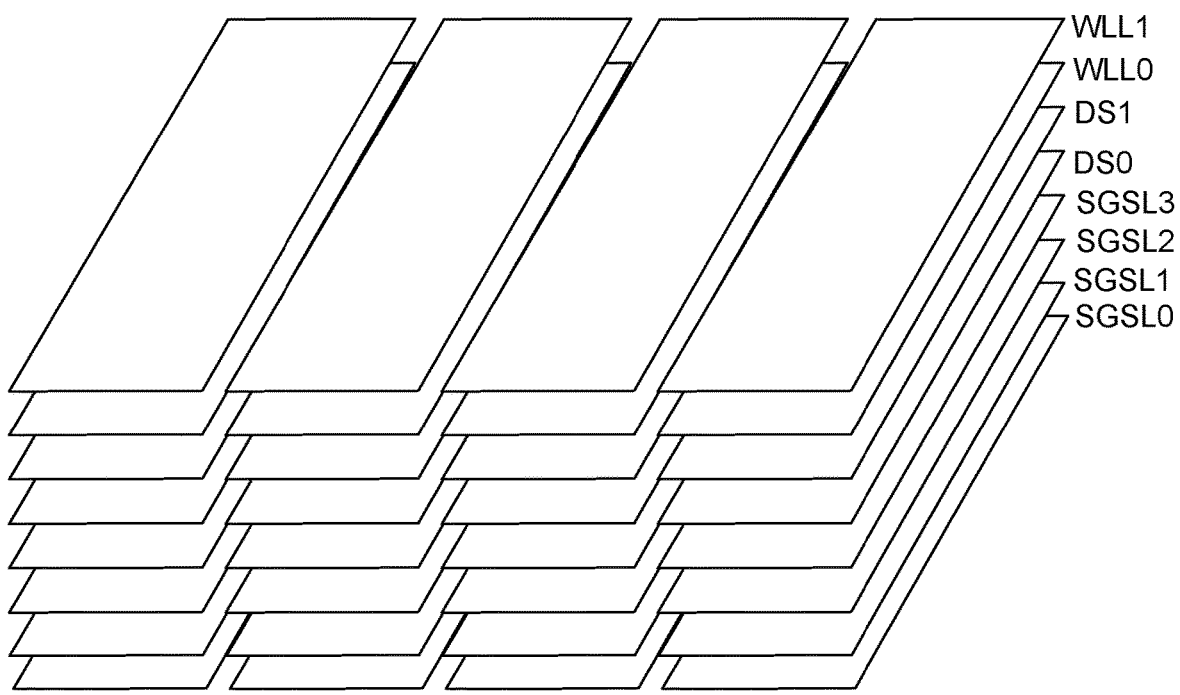

|             | S0 | S1 | S2 | S3 | S4 | S5 | S6 | S7 |
|-------------|----|----|----|----|----|----|----|----|
| Upper Page  | 1  | 1  | 1  | 0  | 0  | 0  | 0  | 1  |
| Middle Page | 1  | 1  | 0  | 0  | 1  | 1  | 0  | 0  |
| Lower Page  | 1  | 0  | 0  | 0  | 0  | 1  | 1  | 1  |

Figure 8
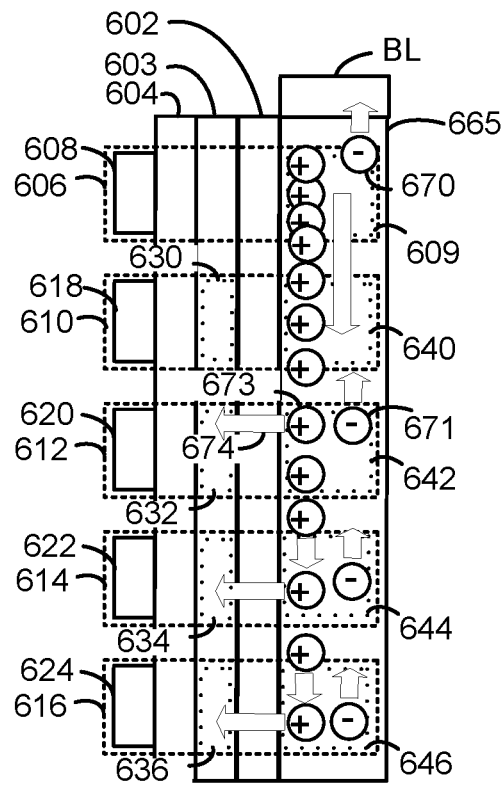
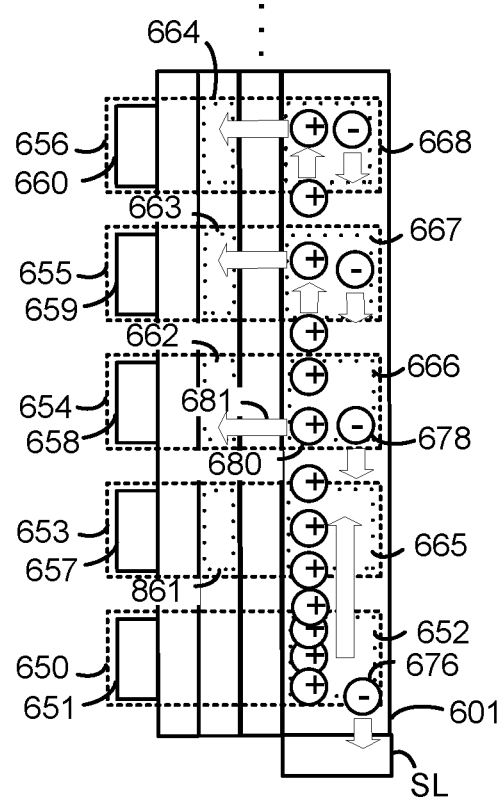

Figure 15

| Skip Parameter | | Sub-Block 0 | Sub-Block 1 | ... | Sub-Block N |
|---|---|---|---|---|---|
| | | 0 | 2 | | 1 |
| Cycle 0 | BL Bias | Vera (initial) | Vera (initial) | | Vera (initial) |
| | WL Bias | 0v | 0v | | 0v |
| | SGD Bias | Vera-V0 | Vera-V0 | | Vera-V0 |
| | Erase Verify | verify fail | Skip erase verify | | skip erase verify |
| Cycle M | BL Bias | Vera+Mx ΔVera1 | Vera+Mx ΔVera1 | | Vera+Mx ΔVera1 |
| | WL Bias | 0v | 0v | | 0v |
| | SGD Bias | Vera-V0 | Vera-V0 | | Vera-V0 |
| | Erase Verify | verify pass | skip erase verify | | skip erase verify |
| Cycle M+1 | BL Bias | Vera+Mx ΔVera1+ ΔVera2 | Vera+Mx ΔVera1+ ΔVera2 | | Vera+Mx ΔVera1+ ΔVera2 |
| | WL Bias | 0v | 0v | | 0v |
| | SGD Bias | Vera-V1 | Vera-V0 | | Vera-V0 |
| | Erase Verify | skip erase verify | skip erase verify | | verify fail |
| Cycle M+2 | BL Bias | Vera+(M+1)x ΔVera1+ ΔVera2 | Vera+(M+1)x ΔVera1+ ΔVera2 | | Vera+(M+1)x ΔVera1+ ΔVera2 |
| | WL Bias | 0v | 0v | | 0v |
| | SGD Bias | Vera-V1 | Vera-V0 | | Vera-V0 |
| | Erase Verify | skip erase verify | verify pass | | verify pass |

Sub-Block 0 is the reference

Figure 16

| Skip Parameter | | Outer Sub-Blocks | Inner Sub-Blocks |
|---|---|---|---|
| | | 0 | 2 |
| Cycle 0 | BL Bias | Vera (initial) | Vera (initial) |
| | WL Bias | 0v | 0v |
| | SGD Bias | Vera-V0 | Vera-V0 |
| | Erase Verify | verify fail | skip erase verify |
| Cycle M | BL Bias | Vera+Mx ΔVera1 | Vera+Mx ΔVera1 |
| | WL Bias | 0v | 0v |
| | SGD Bias | Vera-V0 | Vera-V0 |
| | Erase Verify | verify pass | skip erase verify |
| Cycle M+1 | BL Bias | Vera+Mx ΔVera1+ ΔVera2 | Vera+Mx ΔVera1+ ΔVera2 |
| | WL Bias | 0v | 0v |
| | SGD Bias | Vera-V1 | Vera-V0 |
| | Erase Verify | skip verify | skip erase verify |
| Cycle M+2 | BL Bias | Vera+(M+1)x ΔVera1+ ΔVera2 | Vera+(M+1)x ΔVera1+ ΔVera2 |
| | WL Bias | 0v | 0v |
| | SGD Bias | Vera-V1 | Vera-V0 |
| | Erase Verify | skip erase verify | verify pass |

Outer Sub-Blocks are the reference

_US 11,495,311 B2_

NON-VOLATILE MEMORY WITH ERASE VERIFY SKIP

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). An example of non-volatile memory is flash memory (e.g., NAND-type and NOR-type flash memory).

BRIEF DESCRIPTION OF THE DRAWINGS

Like-numbered elements refer to common components in the different figures.

FIG. 4D depicts a view of the select gate layers and word line layers.

FIG. 8 depicts a NAND string experiencing GIDL erase.

FIG. 15 is a table that describes one example of operation of the non-volatile storage apparatus according to the processes of FIGS. 10, 11 and 14.

FIG. 16 is a table that describes one example of operation of the non-volatile storage apparatus according to the processes of FIGS. 10, 11 and 14.

DETAILED DESCRIPTION

Figure 1:
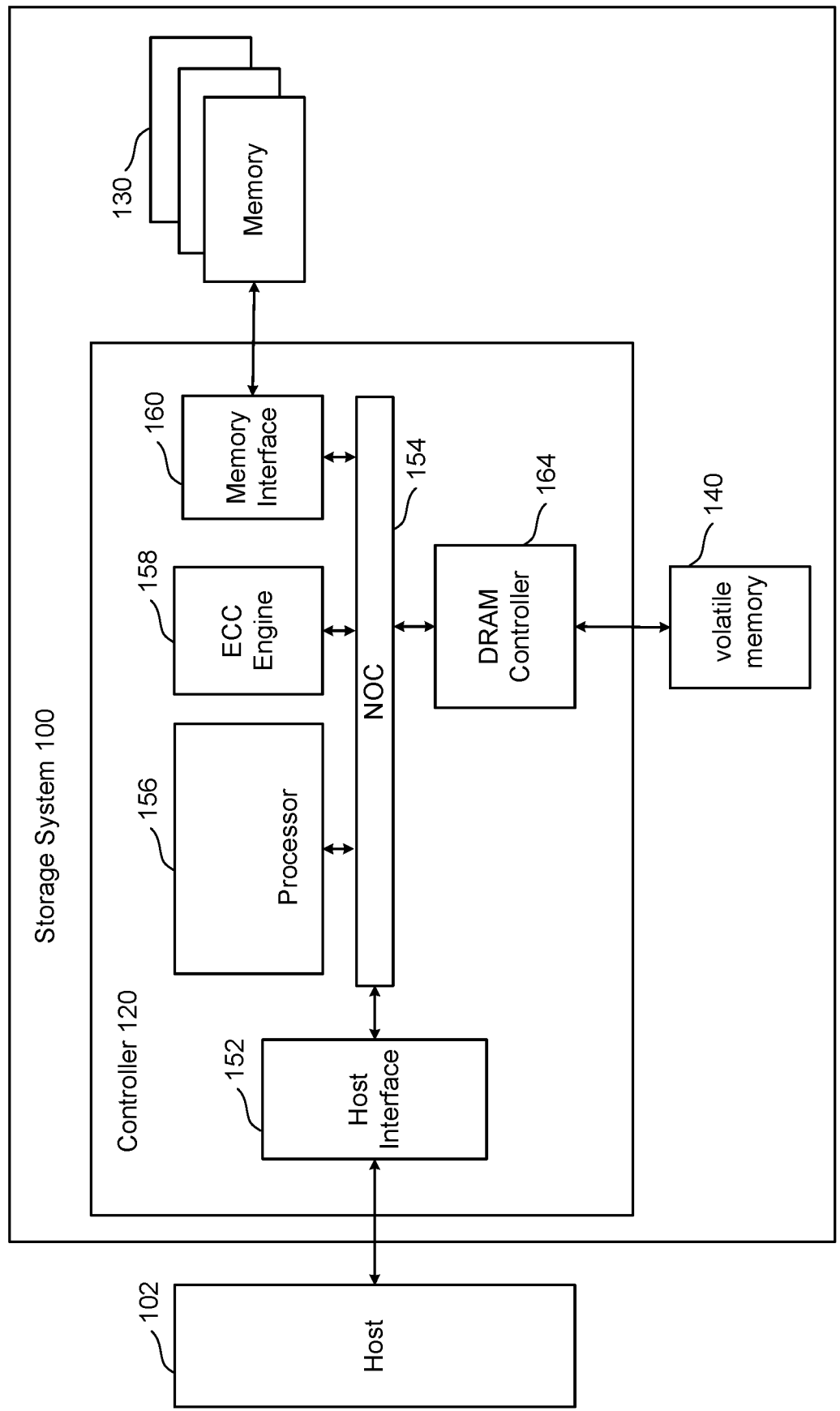
FIG. 1 is a block diagram depicting one embodiment of a memory system.

Apparatuses and techniques are described for optimizing an erase operation in a memory device to compensate for erase speed variations.

An erase operation involves transitioning the memory cells from a programmed state to an erased state. During one embodiment of the erase operation, it is desired to lower the threshold voltage (Vth) of each memory cell below an erase-verify level which represents an erased data state. An erase operation can include a number of erase cycles, where each cycle comprises an erase portion follow by a erase verify portion. In one embodiment of the erase portion, voltages are applied to a block of non-volatile memory cells to provide a positive channel-to-gate voltage for the memory cells of the block to drive electrons out of the charge-storing material of the memory cells, thereby reducing the threshold voltage of the memory cells. In the erase verify portion, an erase verify voltage is applied to the control gates of the memory cells via the word lines of the block, and sensing circuitry is used to sense currents to determine if the memory cells have been sufficiently erased. Memory cells with threshold voltages below the erase verify level will turn on in response to the erase verify voltage being applied to the control gates of the memory cells via the word lines of the block.

The erase speed can vary for different memory cells which, if not compensated for, can lead to variations in depth of erase that have a negative effect on device performance. The erase verify process can be used to account for differences in erase speed. Other processes for dynamically changing voltages during the erase process can also be used to account for differences in erase speed. However, performing many erase verify operations can slow down the erase process and dynamically changing voltages during the erase process can add unnecessary complications to the design and require additional latches/registers to store state information. Therefore, it is proposed that in order to reduce the time used to perform the erase process (which includes the erase verify) and to reduce complexity associated with dynamic operation, the erase verify operation is skipped for certain memory cells based on a predetermined system parameter. For example, when erasing a block of memory cells, a series of erase voltage pulses (or other doses of an erase signal) are applied to the NAND strings (or other groups of connected non-volatile memory cells) in outer sub-blocks and inner sub-blocks of the selected block. Erase verify is performed between erase voltage pulses for NAND strings in the outer sub-blocks of the selected block while skipping erase verify for NAND strings in the inner sub-blocks of the selected block. Performing erase verify between erase voltage pulses for NAND strings in the inner sub-blocks of the selected block is started at a predetermined number of erase voltage pulses (e.g., the system parameter) after the NAND strings in the outer sub-blocks of the selected block successfully erase verify.

One embodiment of the proposed non-volatile storage apparatus comprises a non-volatile memory structure including multiple groups of memory cells and a control circuit connected to the non-volatile memory structure. Each group of memory cells includes a plurality of connected memory cells (e.g., in one embodiment a group is a NAND string). All of the groups are connected to a common bit line and a common word line. A subset of the groups serve as one or more reference groups. Groups of the multiple groups that are not one of the one or more reference group are non-reference groups. The control circuit is configured to apply doses of an erase signal to the groups, perform erase verify between doses of the erase signal for the one or more reference groups until the one or more reference groups successfully erase verify while skipping erase verify between doses of the erase signal for the non-reference groups, and, for each of the non-reference groups, start to perform erase verify between doses of the erase signal at a respective predetermined number of doses of the erase signal after the one or more reference groups successfully erase verify and continue to perform erase verify for the respective non-reference group between doses of the erase signal until the respective non-reference group successfully erase verifies.

FIG. 1 is a block diagram of one embodiment of a memory system 100 that implements the proposed technology, including the proposed erased process. In one embodiment, storage system 100 is a solid state drive ("SSD"). Memory system 100 can also be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 120 connected to one or more memory die 130 and local high speed volatile memory 140 (e.g., DRAM). The one or more memory die 130 each comprise a plurality of non-volatile memory cells. More information about the structure of each memory die 130 is provided below. Local high speed volatile memory 140 is used by controller 120 to perform certain functions. For example, local high speed volatile memory 140 stores logical to physical address translation tables ("L2P tables").

Controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, as well as memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, the controller (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with one or more memory die 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2:
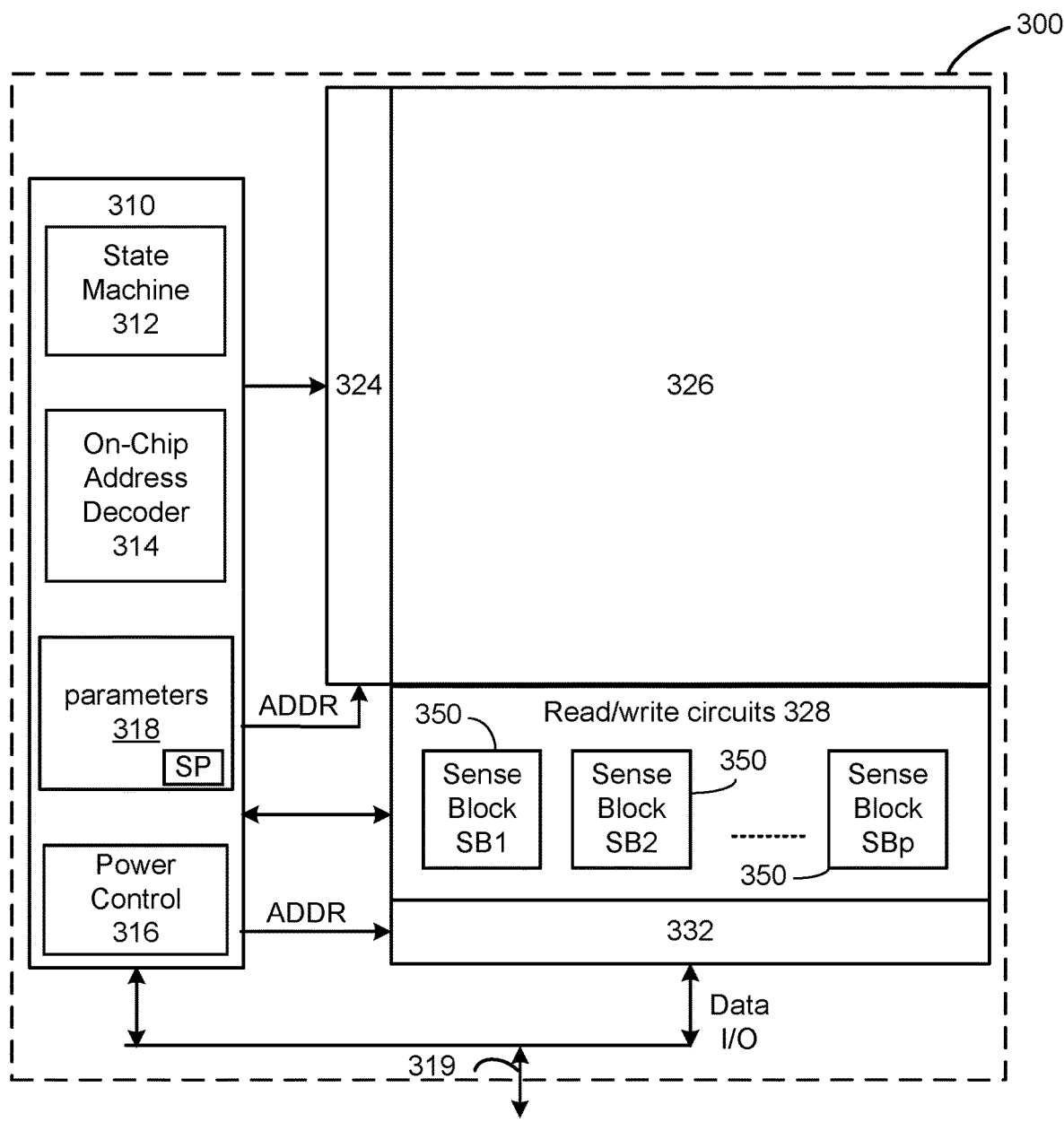
FIG. 2 is a block diagram of one embodiment of a memory die.

FIG. 2 is a functional block diagram of one embodiment of a memory die 300. Each of the one or more memory die 130 of FIG. 1 can be implemented as memory die 300 of FIG. 2. The components depicted in FIG. 2 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed (written) in parallel. In one embodiment, each sense block include a sense amplifier and a set of latches connected to the bit line. The latches store data to be written and/or data that has been read. The sense amplifiers include bit line drivers. Commands and data are transferred between the controller and the memory die 300 via lines 319. In one embodiment, memory die 300 includes a set of input and/or output (I/O) pins that connect to lines 118.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a memory die parameters 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a programmable microcontroller or microprocessor. In one embodiment, control circuitry 310 includes memory die parameters 318 stored in buffers such as registers, latches, ROM fuses and other storage devices. The memory die parameters 318 are default values such as base voltages and other parameters used by memory die 300 (e.g., used by state machines 312) to perform memory operations. One example is the Skip Parameters SP, which are used during the erase process to indicate a predetermined number of erase verify operations to skip, as described below. In one embodiment, the Skip Parameters SP are set during testing as part of the manufacturing of memory die 300 (thus, the Skip Parameters SP are set prior to performing erase processes, including applying erase voltage pulses, for a user).

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, read/write circuits 328 and decoders 324/332 comprise one embodiment of a control circuit for memory structure 326. In other embodiments, other circuits that support and operate on memory structure 326 can be referred to as a control circuit. For example, in some embodiments, the controller can operate as the control circuit or can be part of the control circuit. In some embodiments, the controller in combination with control circuitry 310, read/write circuits 328 and decoders 324/332 comprise one embodiment of a control circuit. In another embodiment, state machine 312 comprises the control circuit. In another embodiment, the host can provide the control circuit.

In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. A NAND string includes memory cells connected by a channel.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ferroelectric memories (FeRAM or FeFET), ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a Ge2Sb2Te5 alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
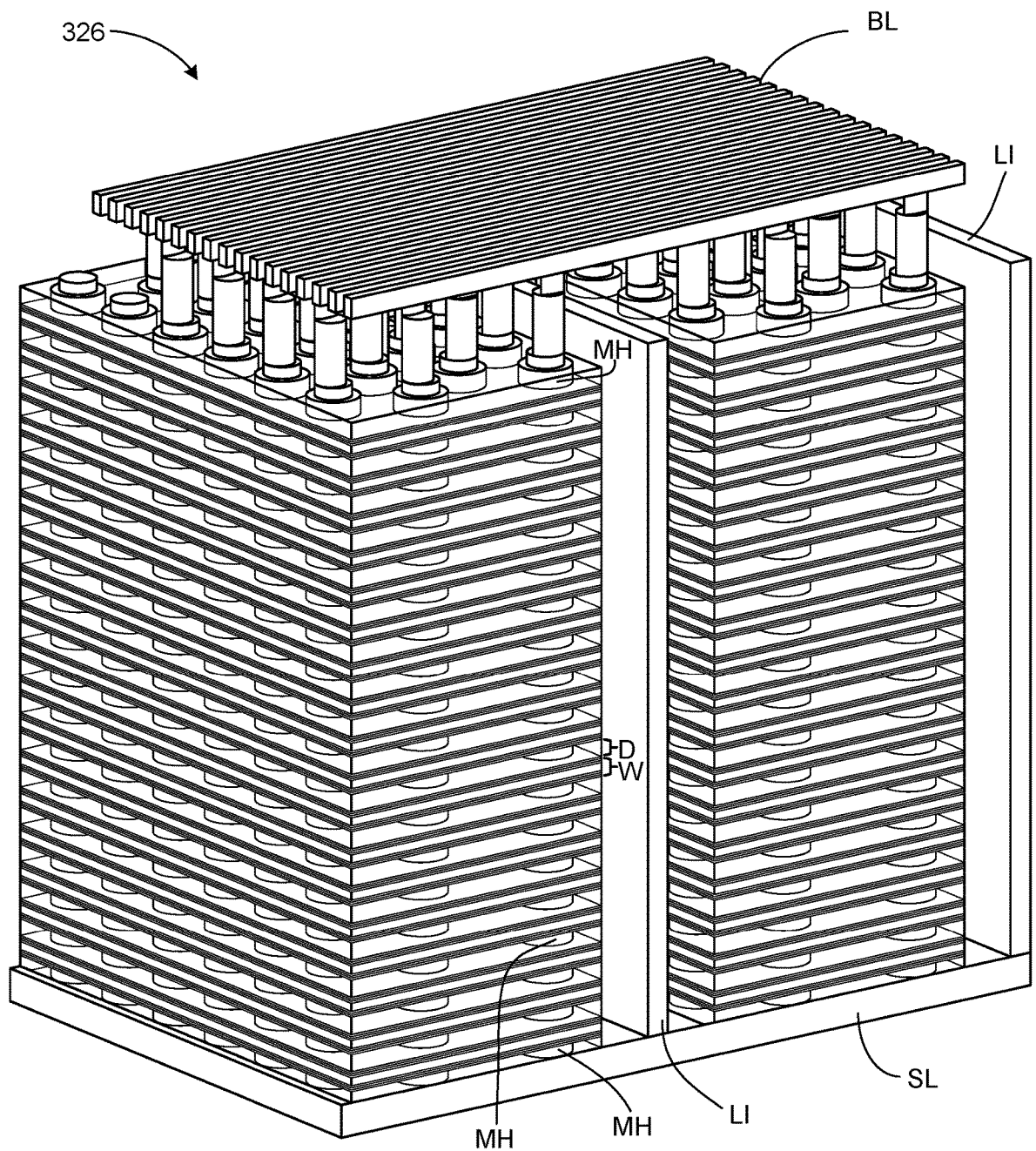
FIG. 3 is a perspective view of a portion of one embodiment of a monolithic three dimensional memory structure.

FIG. 3 is a perspective view of a portion of one example embodiment of a monolithic three dimensional memory array that can comprise memory structure 326, which includes a plurality non-volatile memory cells arranged as vertical NAND strings. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MK Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 326 is provided below with respect to FIG. 4A-4F.

Figure 4A:
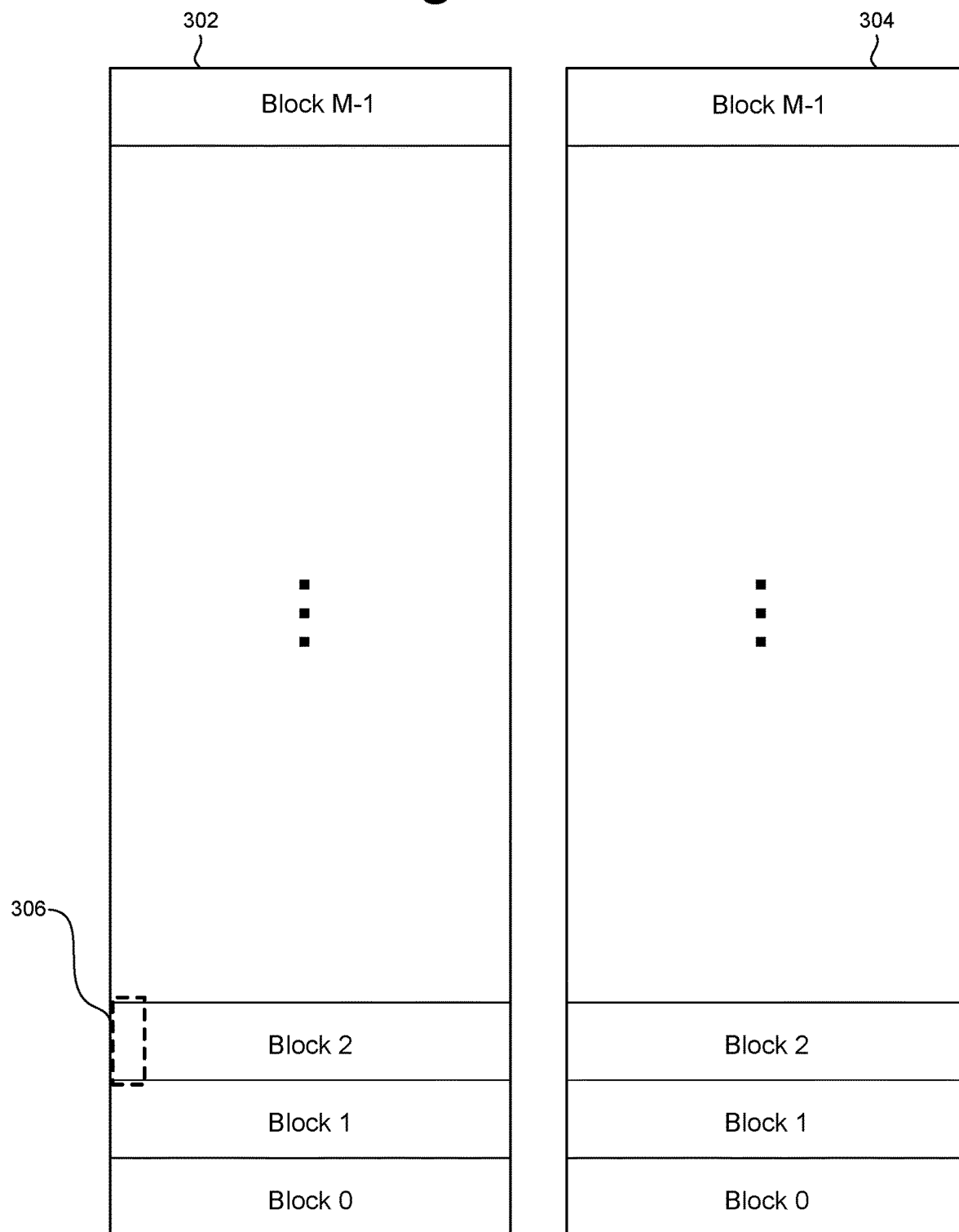
FIG. 4A is a block diagram of a memory structure having two planes.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines.

Figure 4B:
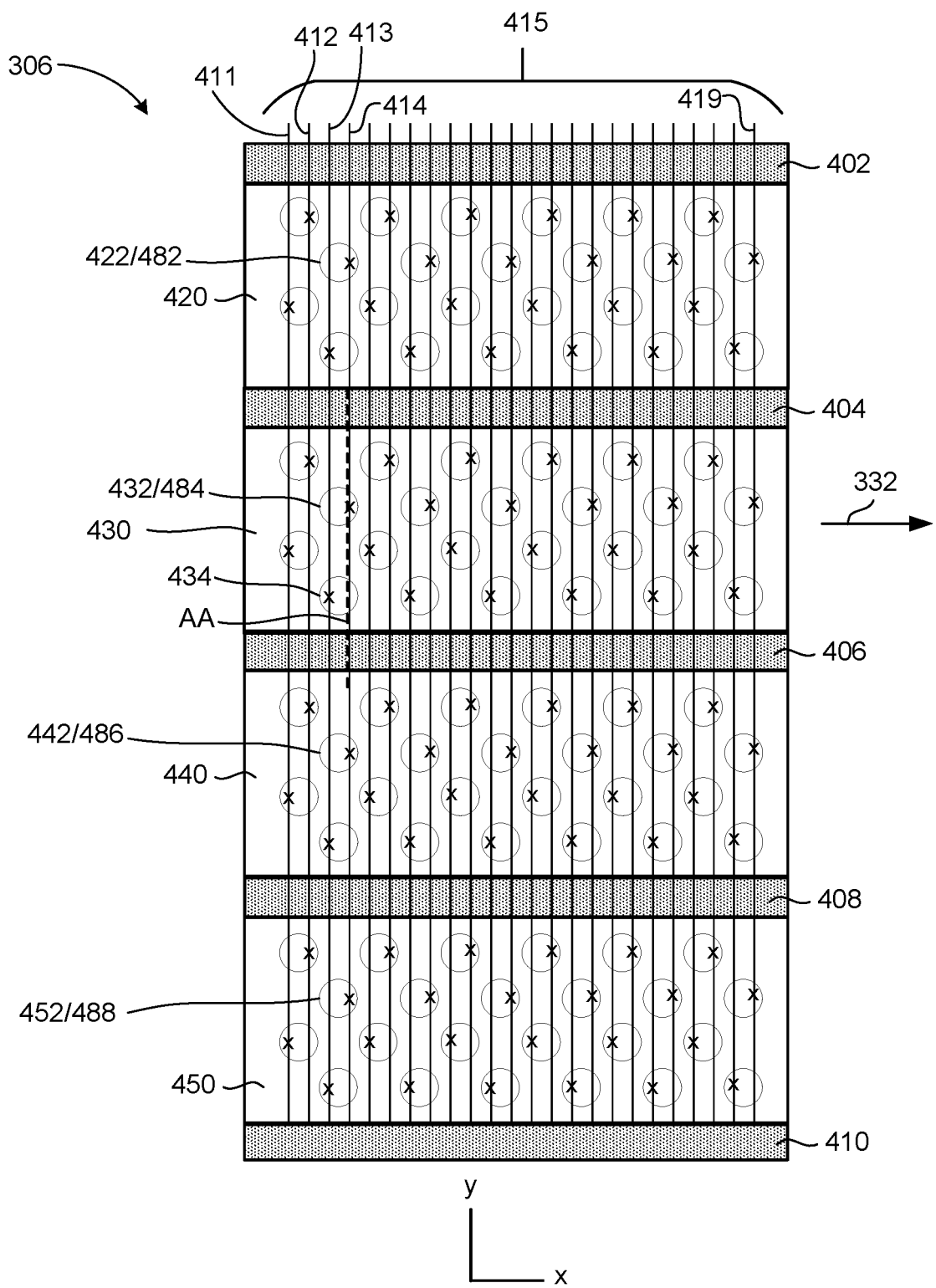
FIG. 4B depicts a top view of a portion of a block of memory cells.

FIGS. 4B-4F depict an example three dimensional ("3D") NAND structure that corresponds to the structure of FIG. 3 and can be used to implement memory structure 326 of FIG. 2. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
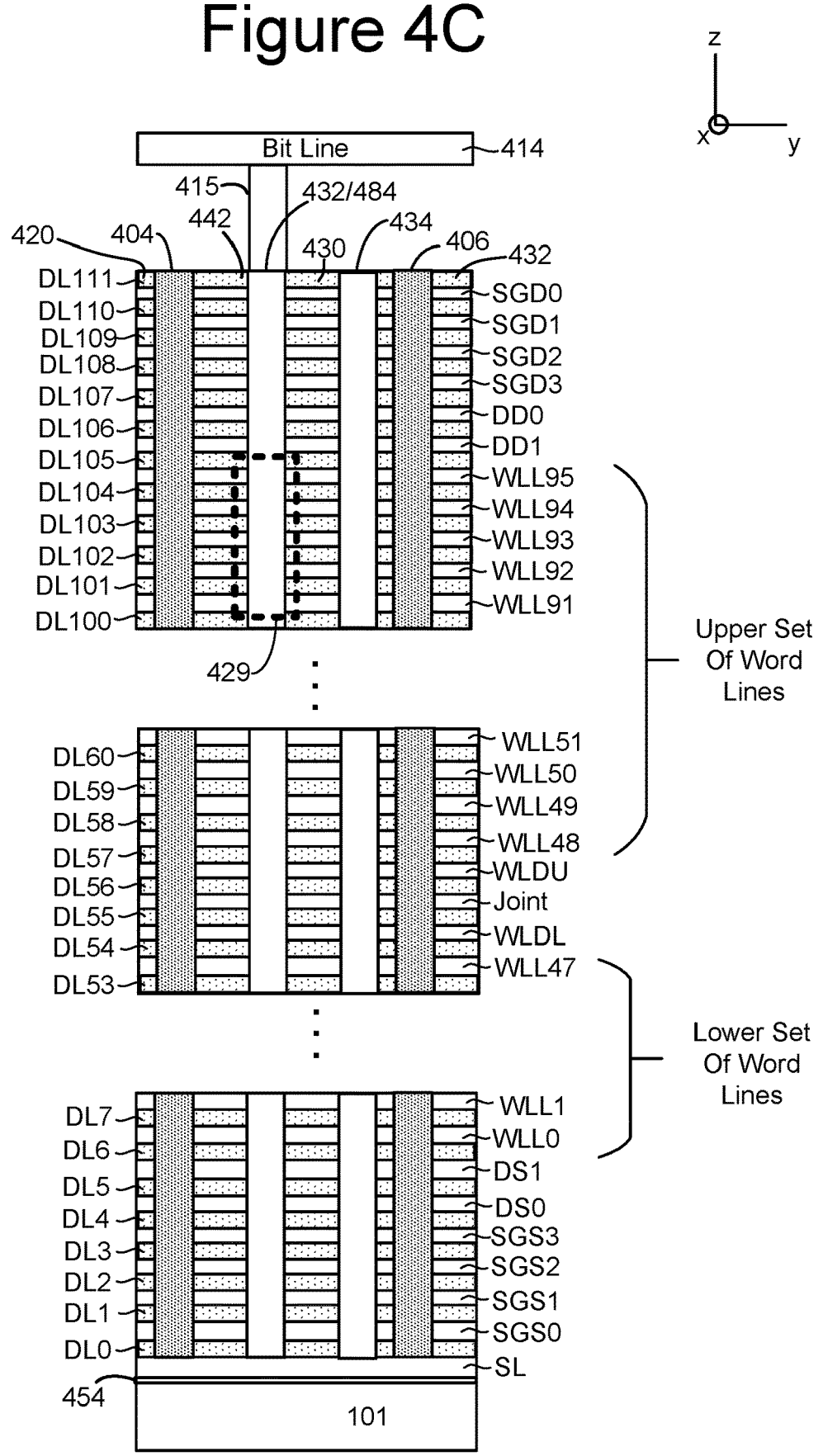
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In FIG. 4C, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL95) for the block that is partially depicted in FIG. 4C. As mentioned above with respect to FIG. 4B, in one embodiment local interconnects 402, 404, 406, 408 and 410 break up the conductive layers into four regions/fingers (or sub-blocks). For example, word line layer WLL94 is divided into regions 460, 462, 464 and 466. For word line layers (WLL0-WLL127), the regions are referred to as word line fingers; for example, word line layer WLL126 is divided into word line fingers 460, 462, 464 and 466. For example, region 460 is one word line finger on one word line layer. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
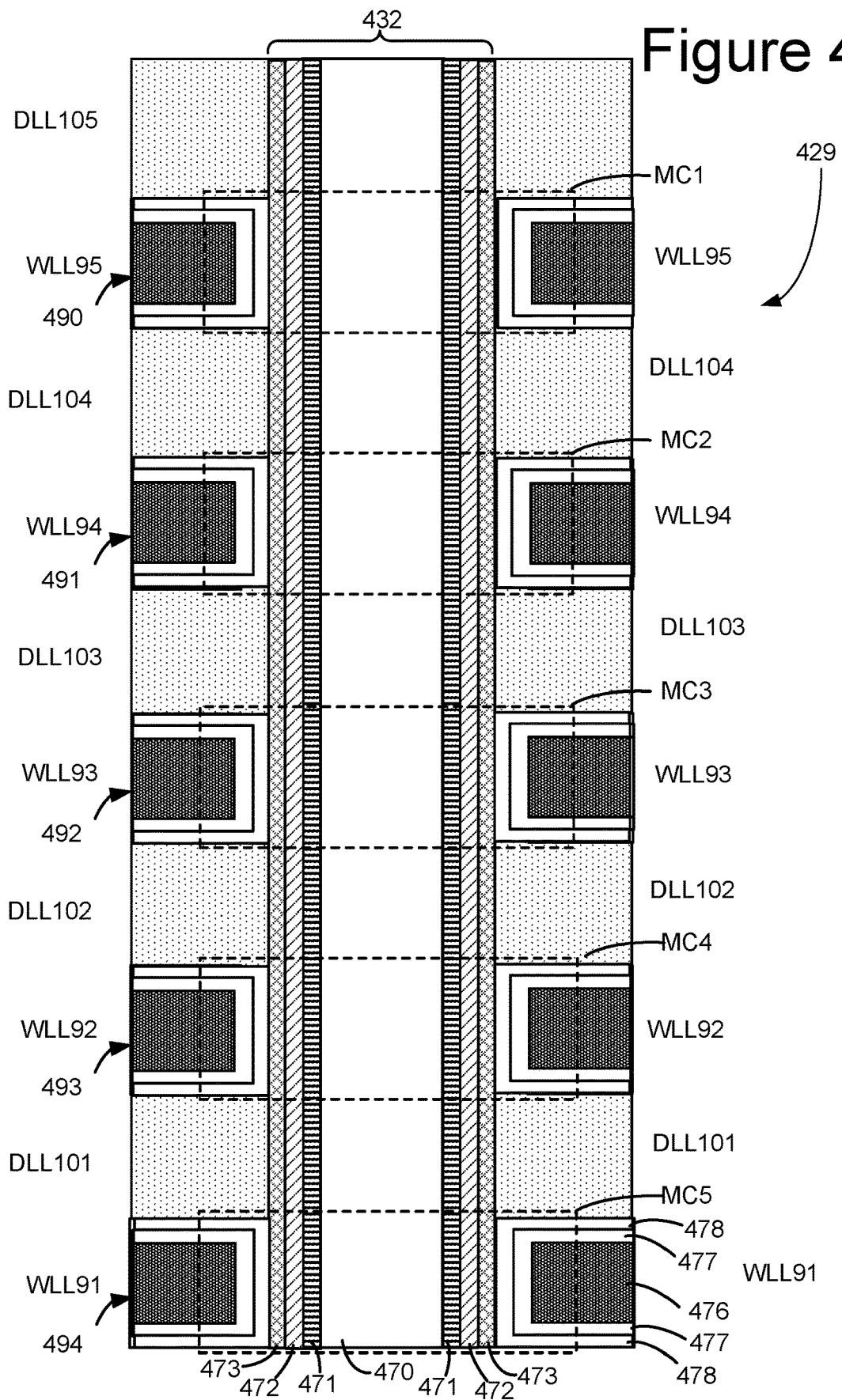
FIG. 4E is a cross sectional view of a vertical column of memory cells.

FIG. 4E depicts a cross sectional view of region 429 of FIG. 4C that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
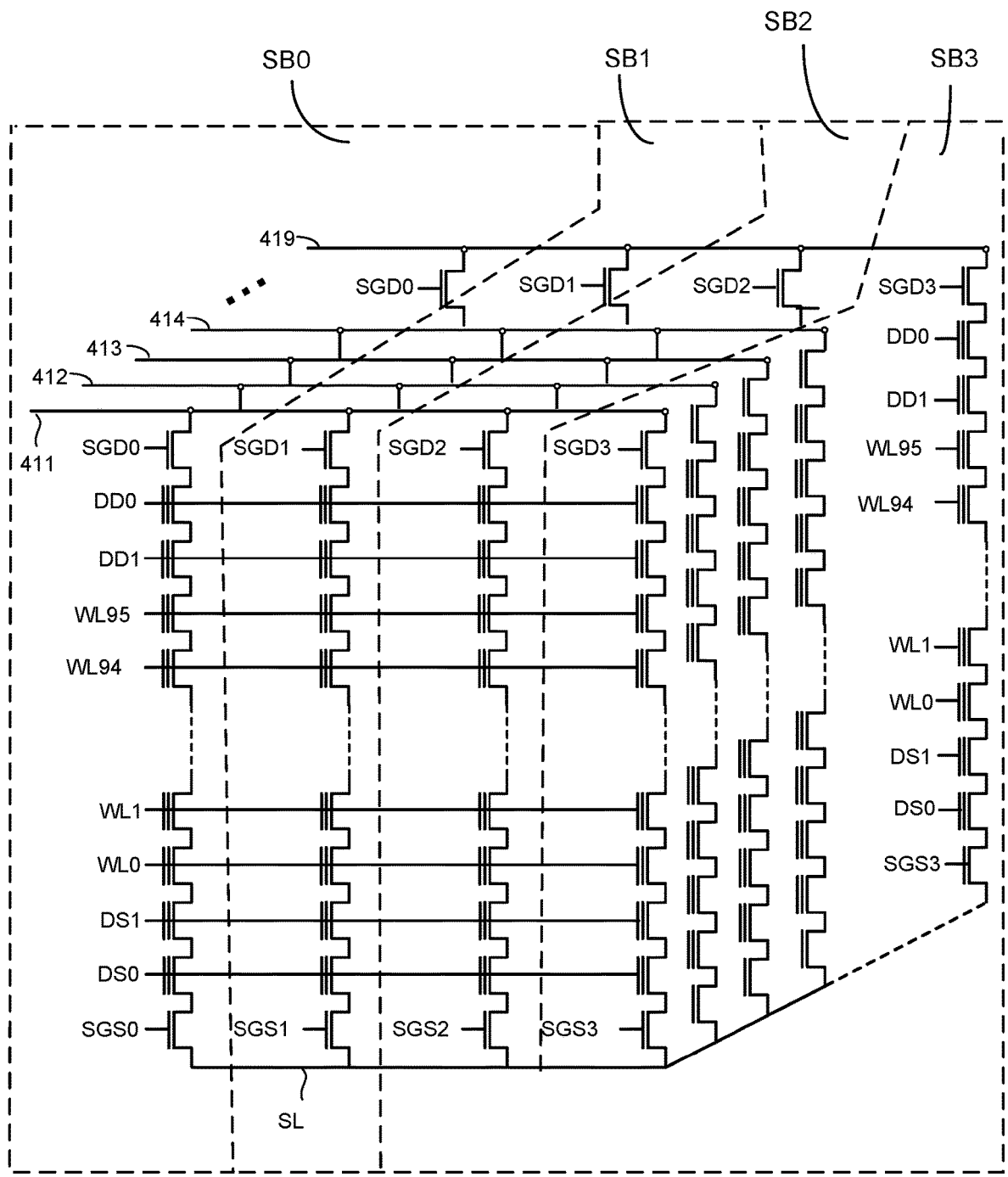
FIG. 4F is a schematic of a plurality of NAND strings showing multiple sub-blocks.

FIG. 4F is a schematic diagram of a portion of the memory depicted in in FIGS. 3-4E. FIG. 4F shows physical word lines WLL0-WLL95 running across the entire block. The structure of FIG. 4F corresponds to portion 306 in Block 2 of FIGS. 4A-E, including bit lines 411, 412, 413, 414, . . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SBO corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 3-4F is a three dimensional memory structure that includes vertical NAND strings with charge-trapping material, other (2D and 3D) memory structures can also be used with the technology described herein.

Figures 5, 6:
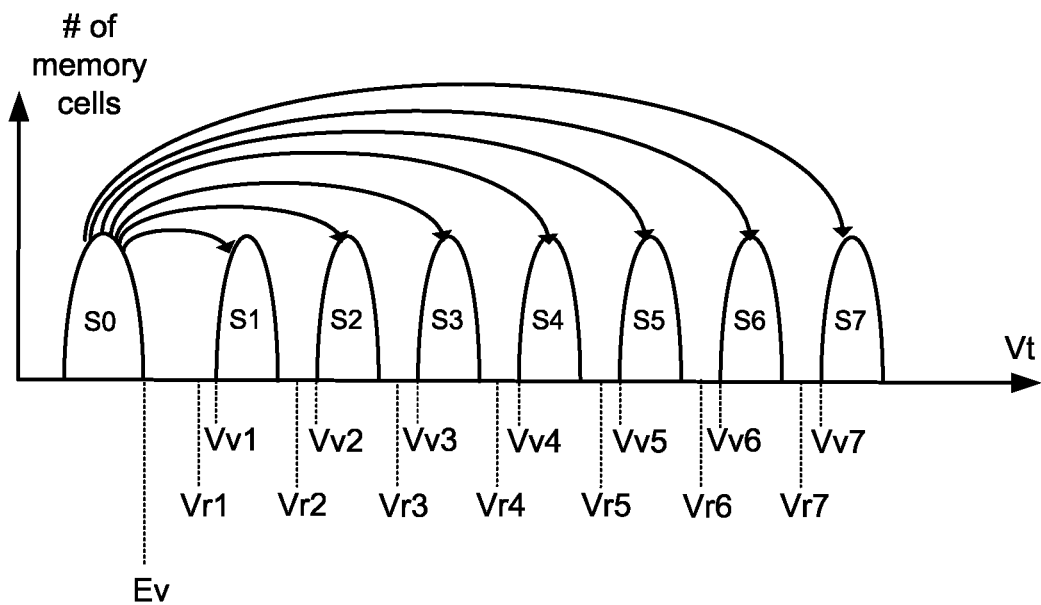
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed states or programmed data states. In some embodiments, data states S1-S7 can overlap, with controller 122 relying on error correction to identify the correct data being stored.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming including (but not limited to) multiple stage/phase programming.

Each threshold voltage distribution (data state) of FIG. 5 corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 6 is a table describing one example of an assignment of data values to data states. In the table of FIG. 6, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Ev, Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 7:
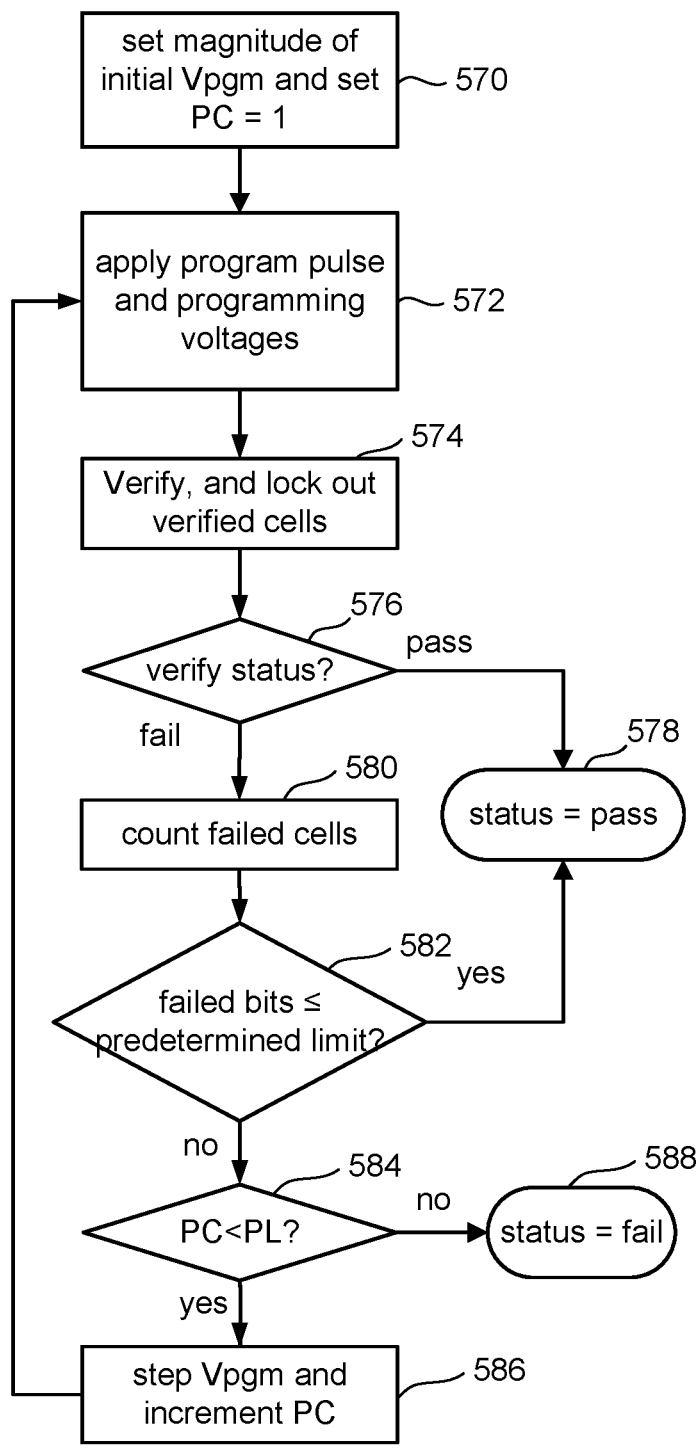
FIG. 7 is a flow chart describing one embodiment of a process for programming non-volatile memory.

FIG. 7 is a flowchart describing one embodiment of a process for programming that is performed by memory die 300. In one example embodiment, the process of FIG. 7 is performed on memory die 300 using the control circuit discussed above, at the direction of state machine 312. The process of FIG. 7 is performed to implement the full sequence programming od FIG. 5, as well as other programming schemes including multi-stage programming. When implementing multi-stage programming, the process of FIG. 7 is used to implement any/each stage of the multi-stage programming process.

Typically, the program voltage applied to the control gates (via a selected word line) during a program operation is applied as a series of program pulses (voltage pulses). Between programming pulses are a set of verify pulses to perform verification. In many implementations, the magnitude of the program pulses is increased with each successive pulse by a predetermined step size. In step 570 of FIG. 7, the programming voltage (Vpgm) is initialized to the starting magnitude (e.g., ~12-16V or another suitable level) and a program counter PC maintained by state machine 312 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. In one embodiment, if a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 574, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 576, it is determined whether all the memory cells have reached their target threshold voltages (pass). If so, the programming process is complete and successful because all selected memory cells were programmed and verified to their target states. A status of "PASS" (or success) is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of memory cells that have, so far, failed the verify process. This counting can be done by the state machine 312, the controller 120, or other logic. In one implementation, each of the sense blocks will store the status (pass/fail) of their respective memory cells. In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is a number of bits that can be corrected by error correction codes (ECC) during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to one or more thresholds in step 582.

In one embodiment, the predetermined limit can be less than the total number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 584 and the program counter PC is checked against the program limit value (PL). Examples of program limit values include 6, 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line so that another iteration (steps 572-586) of the programming process of FIG. 7 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, controller 102 receives host data (also referred to as user data or data from an entity external to the memory system), also referred to as information bits, that is to be stored non-volatile memory structure 326. The informational bits are represented by the matrix i=[1 0] (note that two bits are used for example purposes only, and many embodiments have code words longer than two bits). An error correction coding process (such as any of the processes mentioned above or below) is implemented by ECC engine 158 of controller 120 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R.G. Gallager, "Low-density parity-check codes," IRE Trans. Inform. Theory, vol. IT-8, pp. 21 28, Jan. 1962; and D. MacKay, Information Theory, Inference and Learning Algorithms, Cambridge University Press 2003, chapter 47. In practice, such LDPC codes are typically applied (e.g., by ECC engine 158) to multiple pages encoded across a number of storage elements, but they do not need to be applied across multiple pages. The data bits can be mapped to a logical page and stored in memory structure 326 by programming one or more memory cells to one or more programming states, which corresponds to v.

In one embodiment, programming serves to raise the threshold voltage of the memory cells to one of the programmed data states S1-S7. Erasing serves to lower the threshold voltage of the memory cells to the Erase data state S0.

One technique to erase memory cells in some memory devices is to bias a p-well (or other types of) substrate to a high voltage to charge up a NAND channel. An erase enable voltage is applied to control gates of memory cells while the NAND channel is at a high voltage to erase the non-volatile storage elements (memory cells). Another approach to erasing memory cells is to generate gate induced drain leakage (GIDL) current to charge up the NAND string channel. An erase enable voltage is applied to control gates of the memory cells, while maintaining the string channel potential to erase the memory cells.

In one embodiment, the GIDL current is generated by causing a drain-to-gate voltage at a select transistor. A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to a bit line to generate a first GIDL current. A second GIDL voltage may be created between two terminals of a select transistor (e.g., source side select transistor) that is connected to a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

FIG. 8 depicts the movement of holes and electrons in a NAND string during a two-sided GIDL erase. An example NAND string 600 that includes a channel layer 601 connected to a bit line (BL) and to a source line (SL). A tunnel dielectric layer 602, charge trapping layer 603, and a blocking oxide layer 604 are layers which extend around the memory hole of the NAND string, as discussed above with respect to FIG. 4E. Different regions of the channel layers represent channel regions which are associated with respective storage elements or select gate transistors. These channel regions are at a same height and stack level in the stacked memory device as the control gates of the storage elements or select gate transistors.

The NAND string 600 includes an SGD transistor 606 with a control gate 608 and a channel region 609. The NAND string 600 also includes storage elements 610, 612, 614, and 616;1 control gates 618, 620, 622, and 624; charge trapping layer regions 630, 632, 634, and 636; and channel regions 640, 642, 644, and 646, respectively. The NAND string 600 includes an SGS transistor 650 with a control gate 651 and a channel region 652. The NAND string 600 also includes storage elements 653, 654, 655, and 656; control gates 657, 658, 659, and 660; CTL regions 661, 662, 663, and 664; and channel regions 665, 666, 667, and 668, respectively.

Representative holes are depicted in the channel layers as circles with a "+" sign and representative electrons are depicted in the channel layers as circles with a "−" sign. Electron-hole pairs are generated by a GIDL process. Initially, during an erase operation, the electron-hole pairs are generated at the SGD and SGS transistors. The holes move away from the driven ends into the channel, thereby charging the channel to a positive potential. The electrons generated at the SGD transistor 606 move toward the bit line (BL) due to the positive potential there. The electrons generated at the SGS transistor 650 move toward the source line (SL) due to the positive potential there. Subsequently, during the erase period of each storage element, additional holes are generated by GIDL at virtual junctions which are formed in the channel at the edges of the control gate of the storage element. However, some holes are also removed from the channel as they tunnel to the charge trapping layer regions.

Initially, during the erase operation, the electrons are generated at the SGD and SGS transistors and move toward the driven ends. Subsequently, during the erase period of each storage element, additional electrons are generated by GIDL at virtual junctions, which are formed in the channel at the edges of the control gate of the storage element.

At one end (e.g., drain side) of the NAND string, example electrons 670 and 671 move toward the bit line. Electron 670 is generated at the SGD transistor and electron 671 is generated at a junction of the storage element 612 in the channel region 642. Also, in the drain side, example holes including a hole 673 that move away from the bit line as indicated by arrows. The hole 673 is generated at a junction of the storage element 612 in the channel region 642 and can tunnel into the CTL region 632 as indicated by arrow 674.

At the other end (e.g., source side) of the NAND string, example electrons 676 and 678 move toward the source line. Electron 676 is generated at the SGS transistor and electron 678 is generated at a junction of the storage element 654 in the channel region 666. Also, in the source side, example holes including a hole 680 move away from the source line as indicated by the arrow. The hole 680 is generated at a junction of the storage element 854 in the channel region 666 and can tunnel into the charge trapping layer region 662 as indicated by arrow 681.

During the erase operation, it is desired to lower the threshold voltage (Vth) of each memory cell below an erase-verify level which represents an erased data state. An erase operation can include a number of erase cycles, where each cycle comprises an erase portion follow by a verify portion. In the erase portion, voltages are applied to the block to provide a positive channel-to-gate voltage for the memory cells of the block to drive electrons out of the charge-storing material of the cells, thereby reducing the Vth of the memory cells. In the verify portion, a verify voltage (e.g., Ev, see FIG. 5) is applied to the control gates of the memory cells via the word lines of the block, and sensing circuitry is used to sense currents in the NAND strings to determine if the memory cells have been sufficiently erased. If all of the memory cells of a NAND string have been sufficiently erased (e.g., because their Vth is below Ev), then the NAND string will conduct a sufficient current (in response to Ev applied to the word lines) sensed by the sense amplifiers.

As described above, in one embodiment a positive channel-to-gate voltage is obtained by charging up (increasing a voltage of) the channels of the NAND strings by introducing holes (positive charges) into the channel. One approach mentioned above is to generate holes by gate-induced drain leakage (GIDL) at the SGD transistors of the NAND strings. GIDL can be generated in proportion to a drain-to-gate voltage of the SGD transistors, where the drain voltage is equal to the bit line voltage.

The erase speed can vary for memory cells of different NAND strings based on their distance from the edge of a block due to different thicknesses of the blocking oxide layer (see e.g., blocking oxide (SiO2) layer 478 of FIG. 4E). When fabricating the memory array, an etchant is introduced to remove the sacrificial material for the word lines before depositing the metal of the word lines during the fabrication of the block. In addition to removing the sacrificial material, the etchant removes some of the blocking oxide layer of the memory cells. Moreover, the blocking oxide layers which are closest to the edge of the block receive the most etching and become the thinnest. Thus, the thickness of the blocking oxide layers varies for memory holes based on their distance from the closest edge of the block from which an etchant is introduced. A thinner blocking oxide layer results in a faster erase speed because the gate-to-channel distance decreases. With a given gate-to-channel voltage in the erase operation, the electric field strength is larger when the gate-to-channel distance is smaller.

Since different sub-blocks of a block of memory cells (se e.g. sub-blocks SB0, SB1, SB2 and SB3 of FIG. 4F) are at different positions from the edges of the block, the vertical NAND strings in different sub-blocks will have different erase speeds. Thus, NAND strings positioned in outer sub-blocks (e.g., sub-blocks SB0 and SB3 of FIG. 4F, which are closer to the edge of the block) will have faster erase speeds than NAND strings positioned in inner sub-blocks (e.g., sub-blocks SB1 and SB2 of FIG. 4F, which are further from the edge of the block). Having significant differences in erase speed could lead to over-erase and/or inefficient (e.g., slow) erase processes.

The erase verify process can be used to account for differences in erase speed. However, performing many erase verify operations can slow down the erase process and dynamically changing voltages during the erase process can add unnecessary complications to the design and require additional latches/registers to store state information. Therefore, it is proposed that in order to reduce the time used to perform the erase process (which includes the erase verify) and to reduce complexity associated with dynamic operation, the erase verify operation is skipped for certain memory cells based on a predetermined system parameter that is related to position in the block with respect to the edge of the block (e.g., based on sub-block position). For example, when erasing a block of memory cells, a series of erase voltage pulses (or other doses of an erase signal) are applied to the NAND strings (or other groups of connected non-volatile memory cells) in outer sub-blocks and inner sub-blocks of the selected block. Erase verify is performed between erase voltage pulses for NAND strings in the outer sub-blocks of the selected block while skipping erase verify for NAND strings in the inner sub-blocks of the selected block. Performing erase verify between erase voltage pulses for NAND strings in the inner sub-blocks of the selected block is started at a predetermined number of erase voltage pulses (e.g., the system parameter) after the NAND strings in the outer sub-blocks of the selected block successfully erase verify.

Figure 9:
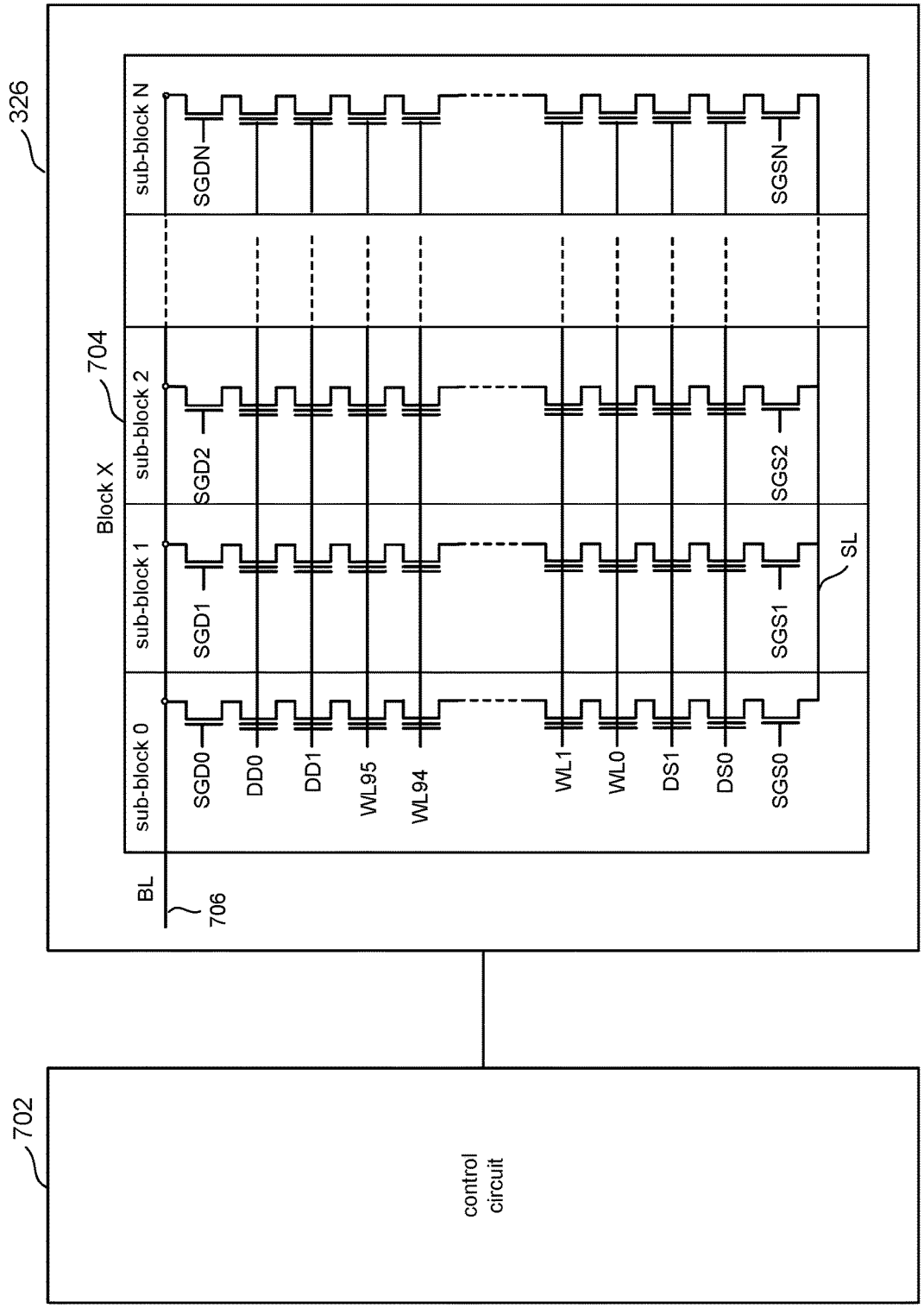
FIG. 9 depicts a non-volatile storage apparatus.

FIG. 9 depicts a non-volatile storage apparatus that can implement the proposed process for erasing non-volatile memory in which the erase verify operation is skipped for certain memory cells based on a system parameter that is related to position in the block. FIG. 9 shows control circuit 702 connected to a block 706 (Block X) of memory structure 326 (see FIGS. 2-4F for more details about memory stricture 326). In one embodiment, control circuit 702 includes a processing circuit on the memory die (e.g., memory die 300 of FIG. 2). For example, control circuit 702 can be a microprocessor, microcontroller, state machine, FPGA, etc. alone or in combination with control logic. As discussed above, control circuit 702 can comprise control circuitry 310, read/write circuits 328 and decoders 324/332. In other embodiments, other circuits that support and operate on memory structure 326 can be referred to as a control circuit. For example, in some embodiments, the controller can operate as the control circuit 702 or can be part of the control circuit 702. In some embodiments, the controller in combination with control circuitry 310, read/write circuits 328 and decoders 324/332 comprise one embodiment of a control circuit 702. In another embodiment, state machine 312 comprises the control circuit 702. In another embodiment, the host can provide the control circuit 702.

Memory 326 will include many blocks of non-volatile memory cells; however, only one block is depicted in FIG. 9 to make the drawing easier to read. Block 704 includes multiple sub-blocks, including sub-block 0, sub-block 1, sub-block 2, . . . sub-block N. In FIG. 4F, N=3; however, in other embodiments there can be more or less than four sub-blocks. The outer sub-blocks are closest to the edge of the block. In the example of FIG. 9, sub-block 0 and sub-block N are outer sub-blocks. In other embodiments, outer sub-blocks can comprise more than one sub-block at each edge. In the example of FIG. 4F, the outer sub-blocks are SB0 and SB3. Inner sub-blocks are further from the edge. In some cases, the inner sub-blocks may be positioned between outer sub-blocks. In some embodiments, each block has two or more outer sub-blocks and one or more inner sub-blocks. In the example of FIG. 4F, the inner sub-blocks are SB1 and SB2. In the example of FIG. 9, the inner sub-blocks are sub-block 1 and sub-block 2. In other embodiments, the sub-blocks are grouped into more than two categories.

In one embodiment, the proposed process for erasing non-volatile memory in which the erase verify operation is skipped for certain memory cells does not divide the sub-blocks into outer and inner. Instead, one or more sub-blocks (or one or more NAND strings) are designated reference sub-blocks (or reference NAND strings), while the remaining sub-blocks are noon-reference sub-blocks (or non-reference NAND strings).

The technology proposed herein is not restricted to NAND and can apply to other groups of memory cells, where each group includes a plurality of connected memory cells. In such embodiments, the non-reference groups comprise groups that are positioned at an interior portion of the memory structure displaced from edges of the of memory structure; and the one or more reference groups comprise one or more groups positioned at one or more outer portions of the memory structure between the interior portion of the memory structure and at least one of the edges of the memory structure. In the example of FIG. 9, either sub-block 0 or sub-block N or both of sub-blocks 0 & N can be reference groups, while sub-block 1, while sub-block 2, . . . while sub-block N−1 are non-reference groups.

Figure 10:
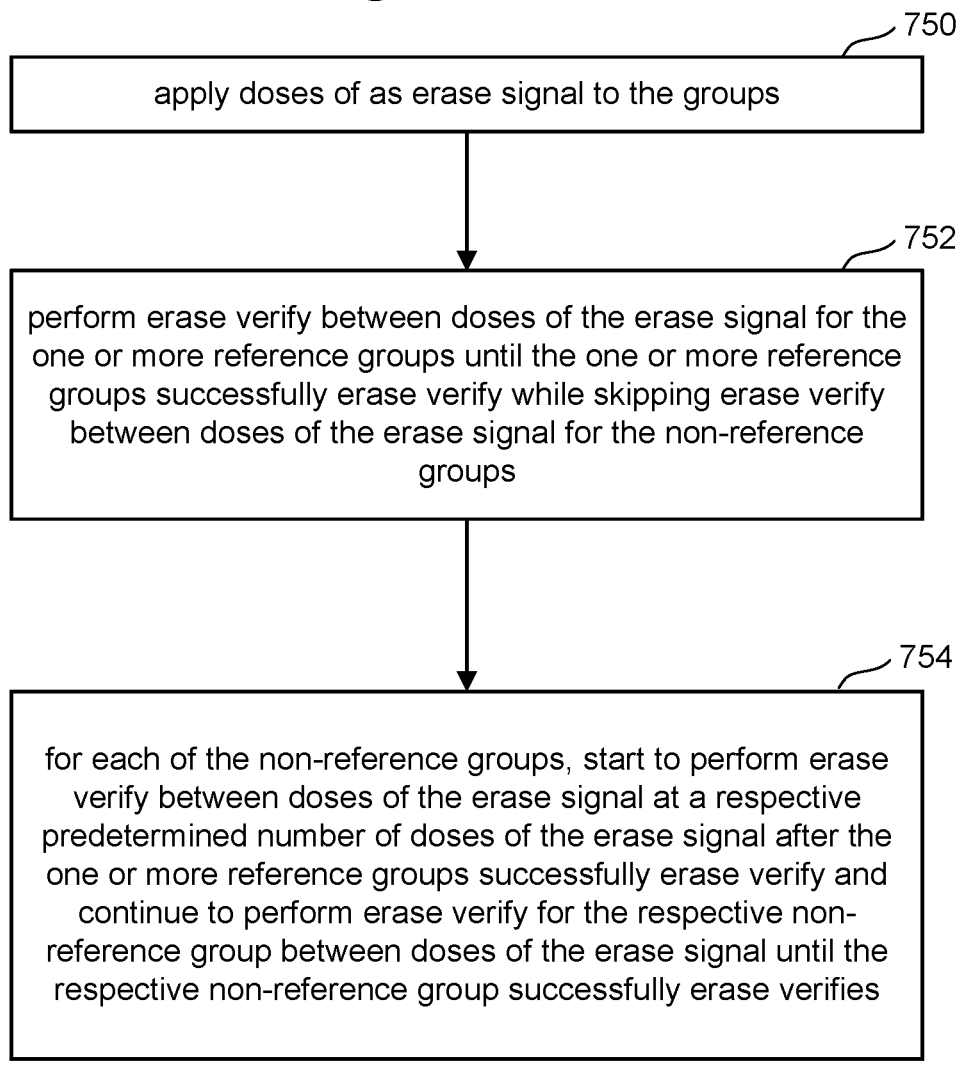
FIG. 10 depicts is a flow chart describing one embodiment of a process for erasing non-volatile memory.

FIG. 10 is a flow chart describing one embodiment of a process of erasing non-volatile memory in which the erase verify operation is skipped for certain memory cells based on a predetermined system parameter that is related to position in the block. That is, FIG. 10 describes one embodiment for operating the system of FIG. 9. In step 750 of FIG. 10, control circuit 702 apply doses of as erase signal to the groups (e.g., NAND strings). In one example embodiment, the erase signal may be a voltage signal that comprises a series of voltage pulses such that each dose of the erase signal is one voltage pulse. A dose can be more than one voltage pulse. A dose can also be another amount or form of voltage other than a pulse. A dose can also be an amount of current or other non-zero quantity.

In step 752, control circuit 702 performs erase verify between the doses of the erase signal for the one or more reference groups until the one or more reference groups successfully erase verify, while skipping erase verify between doses of the erase signal for the non-reference groups. For purposes of this document, skipping erase verify means that the erase verify operation is not performed for the latest dose of the erase signal. Therefore between two example doses of the erase signal (e.g. between two voltage pulses), control circuit 702 will perform the erase verify operation for reference groups and not perform the erase verify operation for non-reference groups. However, in this example, the doses of the erase signal are applied to the reference groups and the non-reference groups so that both the reference groups and non-reference groups experience programming in response to the doses of the erase signal.

In step 754 of FIG. 10, for each of the non-reference groups, control circuit 702 starts to perform erase verify between doses of the erase signal at a respective predetermined number of doses of the erase signal after the one or more reference groups successfully erase verify and continue to perform erase verify for the respective non-reference groups between doses of the erase verify signal until the respective non-reference group successfully erase verifies. The respective predetermined number of doses of the erase signal after the one or more reference groups successfully erase verify is the system parameter referenced above. In one example implementation, that system parameter is referred to the Skip Parameter. So in this example, erase verify is initially only performed for reference groups. After the reference groups successfully erase verify (and one or more additional doses subsequent), erase verify will start to be performed for the non-reference groups. Since the reference groups erase much faster, they will reach their target erase threshold voltage much quicker than non-reference groups. Thus, reference groups will successfully complete erase verify before non-reference groups. Therefore, the system can save time by not performing erase verify for non-reference groups until the reference groups successfully erase verify.

In one embodiment of the process of FIG. 10, the control circuit is configured to apply the doses of erase signal to the groups by applying a series of bursts of voltages such that each burst of voltage is higher in magnitude than in an immediately previous burst of voltage; the bursts of voltage increase by a first step size prior to the one or more reference groups successfully erase verifying; the bursts of voltage increase by a second step size for a dose of the erase signal immediately after the one or more reference groups successfully erase verify (the second step size is larger than the first step size); and the bursts of voltage increase by the first step size subsequent to the dose of the erase signal immediately after the one or more reference groups successfully erase verify. One example of a burst of voltage is a voltage pulse. Other shapes of bursts of voltage can also be used.

In one embodiment, the control circuit 702 is configured to inhibit one or more of the reference groups from erasing after those one or more reference groups successfully erase verify, while applying doses of the erase signal to the non-reference groups. As mentioned above, the respective predetermined number of doses is a system parameter referred to as the Skip Parameter. Control circuit 702 is configured to store that Skip Parameter in parameters 318 (see FIG. 2). Prior to performing the erase process (e.g. prior to applying the doses of erase signal to the groups).

In one embodiment, the control circuit is configured to skip erase verify for the one or more reference groups between doses of the erase signal when the control circuit is configured to perform erase verify for the non-reference group(s). The control circuit 702 is configured to cause the one or more reference groups and the non-reference groups to experience erase in response to the doses of the erase signal prior to the one or more reference groups successfully erase verifying. After the reference groups successfully erase verify, they can be locked out so that they do not experience erase in response to the doses of the erase signal.

Figure 11:
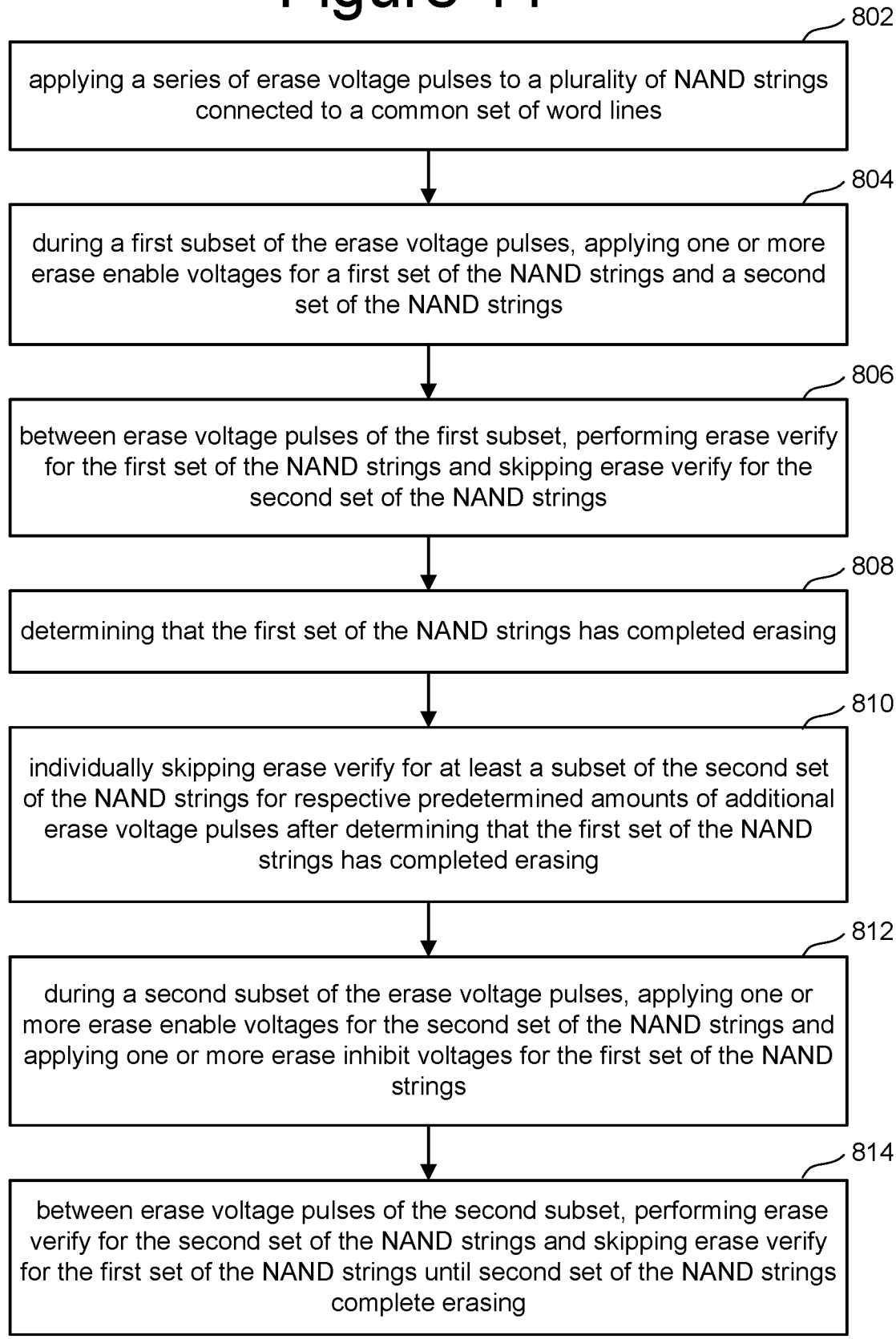
FIG. 11 depicts is a flow chart describing one embodiment of a process for erasing non-volatile memory.

FIG. 11 is a flowchart describing one embodiment of a process for erasing non-volatile memory in which the erase verify operation is skipped for certain memory cells based on a system parameter (e.g. the Skip Parameter) that is related to position in the block. FIG. 11 is an example implementation of the process of FIG. 10 and can be performed by any of the control circuits discussed above. In one embodiment, the process of FIG. 11 is performed on a memory structure that comprises a plurality of NAND strings (e.g. the vertical NAND strings discussed above with respect to FIGS. 2-4F). The plurality of NAND strings includes a first set of NAND strings and a second set of NAND strings, and are part of a non-volatile memory array divided into blocks. Each block is divided into sub-blocks such that each block has at least two outer sub-blocks and at least one inner sub-block. Each sub-block includes multiple vertical NAND strings. The non-volatile memory array includes a plurality of bit lines. For each block, one bit line connects to NAND strings of multiple sub-blocks (e.g., see FIG. 4F). The first set of NAND strings are positioned in one or more outer sub-blocks of a first block. The second set of NAND strings are positioned in one or more inner sub-blocks of the first block. The process of FIG. 11 can also be performed on other suitable structures.

In step 802 of FIG. 11, the control circuit applies a series of erase voltage pulses to a plurality of NAND strings connected to a common set of word lines (e.g. the NAND strings are in the same block). In step 804, during a first subset of the erase voltage pulses, the control circuit applies one or more erase enable voltages to the first set of NAND strings and the second set of NAND strings. The erase enable voltages are voltages applied to the select gates (e.g. SGS and SGD) and the word lines so that the NAND strings will experience erase. In step 806, between erase voltage pulses the first subset of the erase voltage pulses, the control circuit performs erase verify for the first set of NAND strings and skips erase verify for the second set of NAND strings. That is, while both the first set of NAND strings and the second set of NAND strings will be experiencing erase, only the first set of NAND strings will be performing erase verify. In step 808, the control circuit determines that the first set of NAND strings have completed erasing. That is, the control circuit determines that the first set of NAND strings have successfully performed erase verify. For example, looking back at FIG. 5, step 808 includes determining that all of the memory cells in the first set of NAND strings have a threshold voltage less than Ev (the erase verify voltage target). In another embodiment, step 880 only includes determining that one NAND string of the first set of NAND strings has completed erasing. In another embodiment, step 808 only includes determining that a subset of the first set of NAND strings has completed erasing. In step 810, the control circuit will individually skip erase verify for at least a subset of the second set of NAND strings for respective predetermined amounts of additional erase voltage pulses after determining that the first set of the NAND strings have completed erasing. In one embodiment, step 810 includes skipping different predetermined amounts of additional erase voltage pulses for different NAND strings of the second set of the NAND strings. Indications of the different predetermined amounts of additional erase voltages (e.g. the Skip Parameter) are stored in the non-volatile storage apparatus prior to applying the series of erase voltages. In one embodiment, the Skip Parameter is determined during testing performed as part of the manufacturing stage (e.g., at die sort) and stored at that time. In another embodiment, the Skip Parameter is determined by simulation and stored before any use of the memory system.

In step 812, during a second subset of the erase voltage pulses, the control circuit applies one or more erase enable voltages for the second set of NAND strings and applies one or more erase inhibit voltages for the first set of NAND strings. Thus, during the second set of erase voltage pulses, which occur after the first subset of the erase voltage pulses, the first set of NAND strings are inhibited from any further erasing while the second set of NAND strings will continue to erase. As discussed above, the first set of NAND strings erase faster and therefore reach their erase target prior to the second set of NAND strings reaching the erase target. In step 814, between erase voltage pulses of the second subset of the erase voltage pulses, the control circuit performs erase verify for the second set of the NAND strings and skips erase verify for the first set of NAND strings. This process will continue until the second set of NAND strings completes erasing.

Note that in some embodiments, the erase process of FIGS. 10 and/or 11 are performed together with the programming process. In one example implementation, the memory cells will first be programmed and then erased. In some embodiments, erasing is only performed when the memory cells need to be reprogrammed. Thus, erasing can be performed before and/or after programming where the plurality of NAND strings are programmed such that at least a subset of the non-volatile memory cells of the plurality of NAND strings experience an increase in threshold voltage while the erase process causes the NAND strings to experience a decrease in threshold voltage.

In one example embodiment, step 802 of FIG. 11 corresponds to step 750 of FIG. 10, steps 804-808 of FIG. 11 correspond to step 752 of FIG. 10, and steps 810-814 of FIG. 11 correspond to step 754 of FIG. 10.

Figure 12:
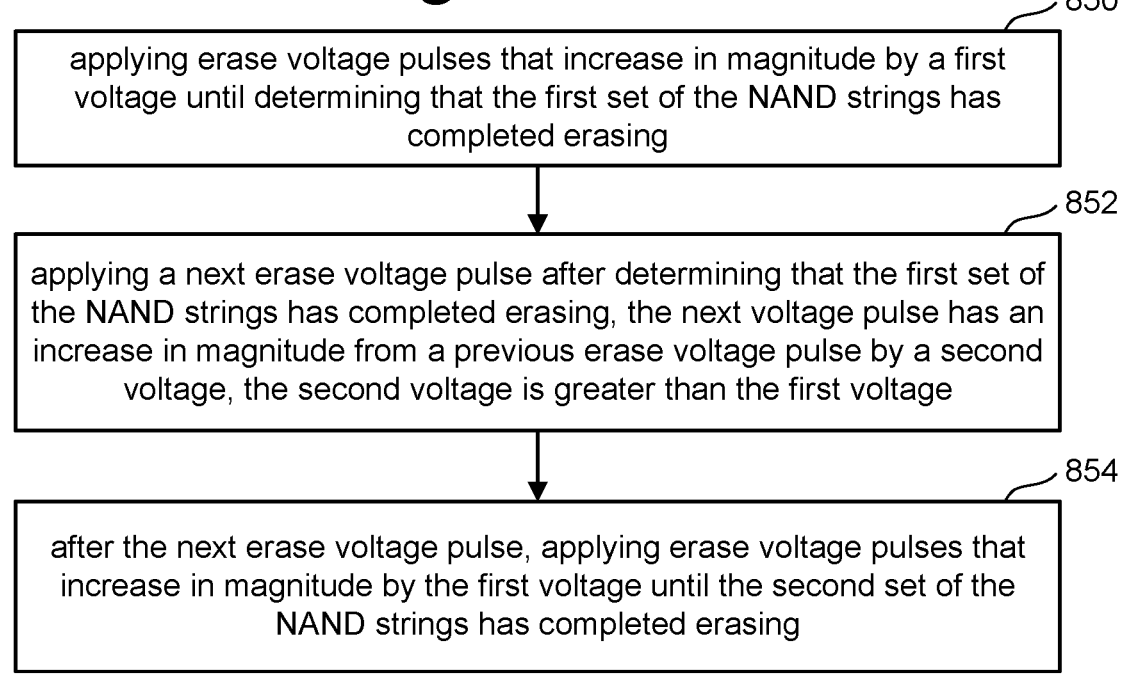
FIG. 12 depicts is a flow chart describing one embodiment of a process for applying a series of erase voltage pulses.

Step 750 of FIG. 11 includes applying a series of erase voltage pulses to the NAND strings. FIG. 12 is a flowchart describing one embodiment of a process for performing step 802 and applying the series of erase voltage pulses. FIG. 12 can also be used to implement step 750 of FIG. 10. In step 850, the control circuit applies erase voltage pulses that increase in magnitude by a first voltage (first step size) until determining that the first set of NAND strings has completed erasing. In step 852, the control circuit applies a next erase voltage pulse after determining that the first set of NAND strings has completed erasing. The next voltage pulse has an increase in magnitude from a previous erase voltage pulse by a second voltage (second step size). The second voltage is greater than the first voltage. In step 854, after the next erase voltage pulse referenced above, the control circuit applies erase voltage pulses that increase the magnitude by the first voltage.

Figure 13:
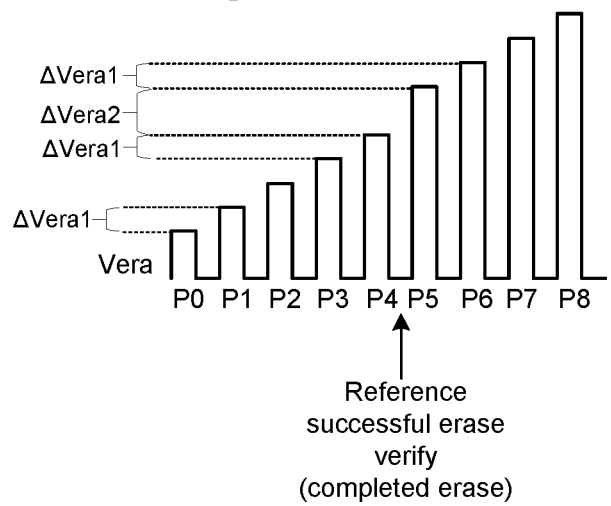
FIG. 13 depicts an erase signal as a series of erase voltage pulses.

FIG. 13 depicts one example embodiment of an erase signal Vera that comprises a plurality of erase voltage pulses P0, P1, P2, P3, P4, P5, P6, P7 and P8. Erase voltage pulse P0 is the initial erase voltage pulse. In one embodiment, the magnitude of the voltage of the initial erase voltage pulse is approximately 17 volts; however, other voltage magnitudes can also be used. During erase voltage pulses P0-P4, each erase voltage pulse increases in magnitude from a previous erase voltage pulse by ΔVera1 (first step size). One example value for ΔVera1 is 0.4 volt; however, other voltage magnitudes can also be used. Between erase voltage pulses, the control circuit performs erase verify, as discussed above. In the example of FIG. 13, after erase voltage pulse P4, the first subset of NAND strings (or reference NAND strings or reference sub-block) successfully erase verifies. Therefore, the next erase voltage pulse P5 has an increment in magnitude (as compared to P4) of ΔVera2 (second step size), where ΔVera2>ΔVera1. For erase voltage pulses after P5, each erase voltage pulse increases in magnitude from a previous erase voltage pulse by ΔVera1.

In one embodiment, ΔVera1 is a parameter that effects erase speed and erase depth. A smaller ΔVera1 results in better erase variation amongst blocks but it slows down the erase process because more erase pulses will be needed. ΔVera2 can be set based on ΔVera1. While in some embodiments ΔVera2 is set to be greater than ΔVera1, in other embodiments ΔVera2 is set to be less than ΔVera1.

Figure 14:
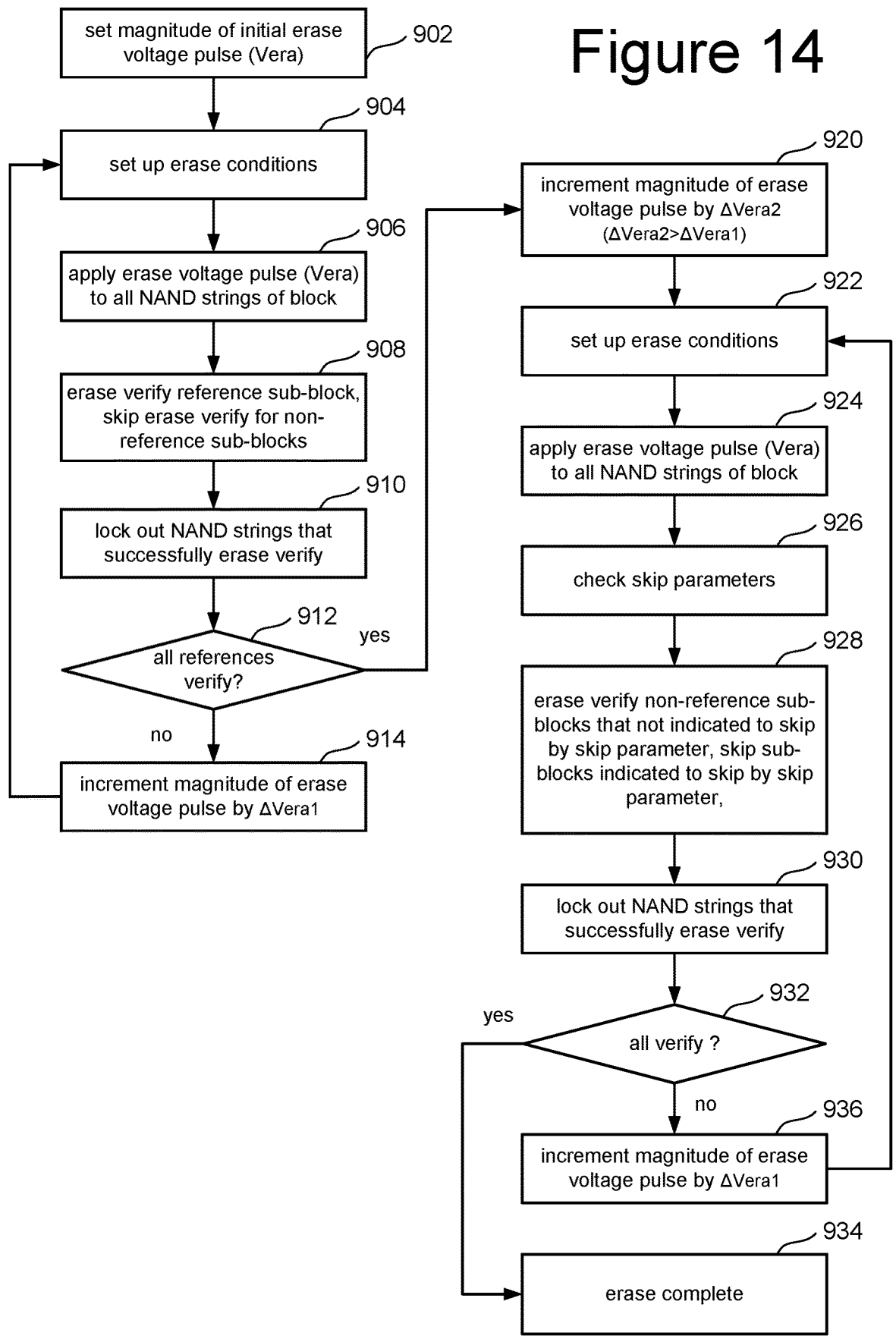
FIG. 14 depicts is a flow chart describing one embodiment of a process for erasing non-volatile memory.

FIG. 14 is a flow chart describing one embodiment of a process for erasing non-volatile memory array in which the erase verify operation is skipped for certain memory cells based on a system parameter that is related to position in the block. In one embodiment, the process of FIG. 14 is performed by the components depicted in FIG. 2, at the direction of state machine 312. In another embodiment, the process of FIG. 14 is performed by the components depicted in FIG. 2, at the direction of controller 120. The process of FIG. 14 can be performed by any of the control circuits discussed above, including the structure of FIG. 9. The process of FIG. 14 is an example implementation of the processes of FIGS. 10 and 11. For example, FIG. 14 describes a process for erasing the non-volatile memory array by applying a series of erase voltage pulses to vertical NAND strings in outer sub-blocks and inner sub-blocks of a selected block, performing erase verify between erase voltage pulses for vertical NAND strings in the outer sub-blocks of the selected block while skipping erase verify for vertical NAND strings in the inner sub-blocks of the selected block and starting to perform erase verify between erase voltage pulses for vertical NAND strings in the inner sub-blocks of the selected block at a predetermined number of erase voltage pulses after the vertical NAND strings in the outer sub-blocks of the selected block successfully erase verify.

In step 902 of FIG. 14, the control circuit sets the magnitude of the initial erase voltage pulse (Vera). This corresponds to setting the voltage level for pulse P0 of FIG. 13. In step 904, the control circuit sets up erase conditions so that the selected NAND strings will all experience erase in response to the next erase pulse. In step 906, the control circuit applies the erase voltage pulse to all NAND strings of the selected block. In other embodiments the erase voltage pulse can be provided to a subset of NAND strings of the block. In one embodiment, the erase voltage pulse is applied to the bit lines for the block. In another embodiment the erase voltage pulse is applied to the source lines for the block. In another embodiment, the erase voltage pulse is applied to both the source lines and the bit lines. In step 908, the control circuit will perform erase verify for the reference sub-block (or reference NAND strings or outer NAND strings), while skipping erase verify for non-reference sub-blocks (or non-reference NAND strings or inner NAND strings). The erase verify operation tests whether the memory cells are properly erased. For example, Ev is applied to the control gates of the memory cells and the sense amplifiers test whether sufficient current runs through the NAND strings.

In step 910, those NAND strings that successfully erase verify (e.g. because the threshold voltage for all the memory cells on the NAND strings is less than Ev—See FIG. 5), will be locked out from further erasing. That is, those NAND strings that are locked out will be inhibited from further erasing. If all reference NAND strings have verified, then the process continues to step 920. If not all the reference NAND strings have verified then the process continues at step 914 such that control circuit will increment the magnitude of the erase voltage pulse by ΔVera1. After step 914, the process loops back to step 904. The loop of steps 904-914 continues to apply erase voltage pulses and verify erase until all of the reference NAND strings successfully are erased and pass erase verify. During this period, although the non-reference NAND strings are skipping erase verify, both the reference NAND strings and the non-reference NAND strings are experiencing erase in response to the erase voltage pulse of step 906.

In step 920, the control circuit increments the magnitude of the erase voltage pulse by ΔVera2 (ΔVera2>ΔVera1). In step 922, the control circuit sets up erase conditions for the NAND strings. In step 924, the control circuit applies the erase voltage pulse to all the NAND strings of the block. In step 926, the control circuit checks the Skip Parameters. In one embodiment, each sub-block will have its own separate Skip Parameter. In another embodiment, each NAND string will have its own Skip Parameter. In another embodiment different groupings of NAND strings or memory cells can have their own Skip Parameter. In one embodiment a Skip Parameter=0 for a sub-block that is a reference sub-block. In one embodiment a Skip Parameter=1 for a sub-block that is a non-reference sub-block to indicate that the sub-block will start performing erase verify one cycle (one erase voltage pulse) after the reference NAND strings all successfully perform erase verify. A Skip Parameter=N means that the sub-block will start performing erase verify at the Nth voltage pulse (or cycle) after all the reference NAND strings successfully erase verify. In step 928, the control circuit will perform erase verify for non-reference sub-blocks that are not indicated to skip by the Skip Parameter. Those blocks that are indicated by the Skip Parameter to not perform erase verify will then skip erase verify in this iteration of step 928. In step 930, those NAND strings that successfully performed erase verify (e.g. threshold voltage of the memory cells of the NAND string are lower than Ev), will be locked out (inhibited) from further erasing. Step 932 includes determining whether all of the NAND strings have now successfully performed erase verify. If not, the magnitude of the next erase voltage pulse is increased by ΔVera1 and the process loops back to step 922 to provide another erase pulse. If all NAND strings have successfully performed erase verify (step 932), then erase process is complete (step 934).

FIGS. 15 and 16 are tables that show examples of operating the processes of FIG. 10, 11 or 14. Both examples show M+3 cycles (cycle 0, cycle 1, . . . Cycle M+2). Each cycle includes applying 1 erase voltage pulse (e.g. step 906 or step 924 of FIG. 14). In the example of FIG. 15, there are N+1 sub-blocks for the selected block. Each sub-block has its own Skip Parameter. Sub-block 0 has a Skip Parameter=0; therefore, sub-block 0 is the reference sub-block. Sub-block 1 has a Skip Parameter of 2. Sub-block N has a Skip Parameter of 1. For each cycle, FIG. 15 shows the voltage applied to the bit line (BL bias), the voltage applied to all of the word lines (WL bias), the voltage is applied to the select gates (SGD bias) and the results of the erase verify process for that sub-block. Because sub-block 0 is the only reference sub-block, the other sub-blocks will skip erase verify until after sub-block 0 successfully performs erase verify. Therefore, in cycle 0, sub-block 0 will perform erase verify and FIG. 15 indicates that the erase verify failed. Sub-block 1 and sub-block N both skip erase verify. FIG. 15 shows that during cycle 0, all bit lines receive the initial erase voltage pulse, the word lines all receive 0 volts and the select gates (SGD) receives a bias of Vera-V0. In one embodiment, V0 is between 6 and 14 volts. In some embodiment, the SGS lines will be the same as the SGD lines. In other embodiments, a one sided GIDL erase process will be used will GIDL is only performed on the drain side. Note that the biasing the word line to 0 volts and the select gates to Vera-V0 is an example of an erase condition, as discussed above with respect to steps 904 and 922 of FIG. 14. In cycle M, sub-block 0 successfully erase verifies. Therefore, in the next cycle (cycle M+1), sub-block N will start performing erase verify because its Skip Parameter=1. However in cycle M+1, sub-block 1 will skip verify because its Skip Parameter=2. During cycle M+1, the bias on the select lines for sub-block 0 is Vera-V1. In one embodiment, V1 is between 0 and 4 volts. This is an example of how to lock out (inhibit) the NAND strings in sub-block 0 from erasing in response to further erase voltage pulses. In cycle M+2, sub-block 0 will be inhibited from erasing and will skip verify, sub-block N will continue to verify erasing and sub-block 1 will perform its first erase verify process. FIG. 15 indicates that erase verify is successful for all sub-blocks in cycle M+2. Therefore, the process of erasing is complete.

FIG. 16 provides an example where the sub-blocks are divided into inner sub-blocks and outer sub-blocks. The Skip Parameter for the inner sub-blocks is 2 and the Skip Parameter for the outer sub-blocks is 0. Therefore, the outer sub-blocks are the reference sub-blocks. In cycle 0 through cycle M, all the sub-blocks will receive the erase conditions, the outer sub-blocks will perform erase verify between erase voltage pulses and the inner sub-blocks will skip erase verify. In cycle M, the outer sub-blocks have all completed erasing and successfully passed the erase verify process. As the Skip Parameter is set at 2 for the inner sub-blocks, the inner sub-blocks will not perform erase verify in cycle M+1 but will start to perform erase verify during cycle M+2. As can be seen from example in FIG. 16, the inner sub-blocks all successfully complete erase verify in cycle M+2; therefore, erase process is complete after cycle M+2. During cycle M+2, the outer sub-blocks are inhibited from erasing (e.g. locked out) and will skip the erase verify. Thus, the inner sub-blocks will start performing the erase verify a predetermined number of pulses after the outer sub-blocks successfully complete erase verify. Not depicted in FIGS. 15 and 16 is that the increments of the erase pulses (Vera) will be higher during cycle M+1 than the other cycles, as described above with respect to FIG. 13.

One embodiment includes a non-volatile storage apparatus comprising a non-volatile memory structure including multiple groups of memory cells and a control circuit connected to the non-volatile memory structure. Each group includes a plurality of connected memory cells. All of the groups are connected to a common bit line and a common word line. A subset of the groups serve as one or more reference groups. Groups of the multiple groups that are not one of the one or more reference group are non-reference groups. The control circuit is configured to apply doses of an erase signal to the groups, perform erase verify between doses of the erase signal for the one or more reference groups until the one or more reference groups successfully erase verify while skipping erase verify between doses of the erase signal for the non-reference groups, and, for each of the non-reference groups, start to perform erase verify between doses of the erase signal at a respective predetermined number of doses of the erase signal after the one or more reference groups successfully erase verify and continue to perform erase verify for the respective non-reference group between doses of the erase signal until the respective non-reference group successfully erase verifies.

One embodiment includes a method for erasing non-volatile storage, comprising: applying a series of erase voltage pulses to a plurality of NAND strings connected to a common set of word lines; during a first subset of the erase voltage pulses, applying one or more erase enable voltages for a first set of the NAND strings and a second set of the NAND strings; between erase voltage pulses of the first subset, performing erase verify for the first set of the NAND strings and skipping erase verify for the second set of the NAND strings; determining that the first set of the NAND strings has completed erasing; individually skipping erase verify for at least a subset of the second set of the NAND strings for respective predetermined amounts of additional erase voltage pulses after determining that the first set of the NAND strings has completed erasing; during a second subset of the erase voltage pulses, applying one or more erase enable voltages for the second set of the NAND strings and applying one or more erase inhibit voltages for the first set of the NAND strings; and between erase voltage pulses of the second subset, performing erase verify for the second set of the NAND strings and skipping erase verify for the first set of the NAND strings until second set of the NAND strings complete erasing.

One embodiment includes a non-volatile storage apparatus comprising a non-volatile memory array divided into blocks. Each block is divided into sub-blocks such that each block has at least two outer sub-blocks and at least two inner sub-blocks. Each sub-block includes multiple vertical NAND strings. The non-volatile memory array includes a plurality of word lines and a plurality of bit lines. A subset of the word lines connect to multiple vertical NAND strings of a block. For each block, one bit line connects to NAND string in multiple sub-blocks. The non-volatile storage apparatus further comprises means for erasing the non-volatile memory array by applying a series of erase voltage pulses to vertical NAND strings in outer sub-blocks and inner sub-blocks of a selected block, performing erase verify between erase voltage pulses for vertical NAND strings in the outer sub-blocks of the selected block while skipping erase verify for vertical NAND strings in the inner sub-blocks of the selected block and starting to perform erase verify between erase voltage pulses for vertical NAND strings in the inner sub-blocks of the selected block at a predetermined number of erase voltage pulses after the vertical NAND strings in the outer sub-blocks of the selected block successfully erase verify. The means for erasing increases an increment of magnitude of the erase voltage pulses for the erase voltage pulse immediately after the vertical NAND strings in the outer sub-blocks of the selected block successfully erase verify.

The means for erasing can be implemented by a microprocessor, microcontroller, state machine, FPGA or other type of processor in combination with decoders, sense amplifiers, voltage and current sources and other control logic performing the processes of FIGS. 10, 11 and/or 14. For example, the means for erasing may comprise control circuitry 310, decoders 324/332 and read/write circuits 328 of FIG. 2 performing the processes of FIGS. 10, 11 and/or 14. In some embodiments, the means for erasing may comprise controller 120 performing the processes of FIGS. 10, 11 and/or 14 with or without support from the circuits on the memory die (e.g., memory die 300 of FIG. 2). In some embodiments, the means for erasing may comprise controller 120, control circuitry 310, decoders 324/332 and read/write circuits 328 performing the processes of FIGS. 10, 11 and/or 14.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A method for erasing non-volatile storage, comprising:
applying a series of erase voltage pulses to a plurality of NAND strings connected to a common set of word lines;
during a first subset of the erase voltage pulses, applying one or more erase enable voltages for a first set of the NAND strings and a second set of the NAND strings;
between erase voltage pulses of the first subset, performing erase verify for the first set of the NAND strings and skipping erase verify for the second set of the NAND strings;
determining that the first set of the NAND strings has completed erasing;
individually skipping erase verify for at least a subset of the second set of the NAND strings for respective predetermined amounts of additional erase voltage pulses after determining that the first set of the NAND strings has completed erasing;
during a second subset of the erase voltage pulses, applying one or more erase enable voltages for the second set of the NAND strings and applying one or more erase inhibit voltages for the first set of the NAND strings; and
between erase voltage pulses of the second subset, performing erase verify for the second set of the NAND strings and skipping erase verify for the first set of the NAND strings until second set of the NAND strings complete erasing.

2. The method of claim 1, wherein the applying the series of erase voltage pulses comprises:
applying erase voltage pulses that increase in magnitude by a first voltage until determining that the first set of the NAND strings has completed erasing;
applying a next erase voltage pulse after determining that the first set of the NAND strings has completed erasing, the next voltage pulse has an increase in magnitude from a previous erase voltage pulse by a second voltage, the second voltage is greater than the first voltage; and
after the next erase voltage pulse, applying erase voltage pulses that increase in magnitude by the first voltage until the second set of the NAND strings has completed erasing.

3. The method of claim 1, wherein:
the first set of NAND strings and the second set of NAND strings are part of a non-volatile memory array divided into blocks, each block is divided into sub-blocks such that each block has at least two outer sub-blocks and at least one inner sub-block, each sub-block includes multiple vertical NAND strings, the non-volatile memory array includes a plurality of bit lines, for each block one bit line connects to NAND strings in multiple sub-blocks, the first set of NAND strings are positioned in one or more outer sub-blocks of a first block, the second set of NAND strings are positioned in one or more inner sub-blocks of the first block.

4. The method of claim 1, wherein individually skipping erase verify for at least a subset of the second set of the NAND strings for respective predetermined amounts of additional erase voltage pulses after determining that the first set of the NAND strings has completed erasing comprises:
skipping different predetermined amounts of additional erase voltage pulses for different NAND strings of the second set of the NAND strings, indications of the different predetermined amounts of additional erase voltage pulses are stored in the non-volatile storage apparatus prior to applying the series of erase voltage pulses.

5. The method of claim 1, further comprising:
programming the plurality of NAND strings such that at least a subset of non-volatile memory cells of the plurality of NAND strings experience an increases in threshold voltage, the applying the series of erase voltage pulses to the plurality of NAND strings causes a subset of non-volatile memory cells to experience a decrease in threshold voltage, the subset of non-volatile memory cells have charge trapping layers, the plurality of NAND strings are vertical NAND strings of a three dimensional memory array.

6. The method of claim 1, wherein:
the second set of the NAND strings are positioned at an interior portion of a memory structure displaced from edges of the of memory structure; and
the first set of the NAND strings are positioned at one or more outer portions of the memory structure between the interior portion of the memory structure and at least one of the edges of the memory structure.

7. The method of claim 1, wherein:
the first set of the NAND strings and the second set of the NAND strings are connected to a common bit line; and
the applying the series of erase voltage pulses to the plurality of NAND strings comprises applying the erase voltage pulses to the common bit line such that the erase voltage pulses increase in magnitude from pulse to pulse.

8. The method of claim 1, wherein:
the plurality of NAND strings are vertical NAND strings of a three dimensional memory structure.

9. The method of claim 8, wherein:
the three dimensional memory structure is divided into blocks of memory cells;
each of the blocks of memory cells are divided into sub-blocks; and
the vertical NAND strings are in different sub-blocks of a first block.

10. The method of claim 9, wherein:
the second set of the NAND strings are positioned at an interior sub-block of the first block; and
the first set of the NAND strings are positioned at an outer sub-block of the first block.

11. A method for erasing non-volatile storage, comprising:
applying a series of erase voltage pulses to groups of memory cells, each group of memory cells includes a plurality of connected memory cells, all of the groups are connected to a common set of word lines;
during a first subset of the erase voltage pulses, applying one or more erase enable voltages for a first set of the groups of memory cells and a second set of the groups of memory cells;
between erase voltage pulses of the first subset, performing erase verify for the first set of the groups of memory cells and skipping erase verify for the second set of the groups of memory cells;
determining that the first set of the groups of memory cells has completed erasing;
skipping erase verify for at least a subset of the second set of the groups of memory cells for respective predetermined amounts of additional erase voltage pulses after determining that the first set of the groups of memory cells has completed erasing;
during a second subset of the erase voltage pulses, applying one or more erase enable voltages for the second set of the NAND strings; and
between erase voltage pulses of the second subset, performing erase verify for the second set of the groups of memory cells.

12. The method of claim 11, wherein:
the first set of the groups of memory cells and the second set of the groups of memory cells are connected to a common bit line.

13. The method of claim 11, wherein:
the second set of the groups of memory cells are positioned at an interior portion of a memory structure displaced from edges of the of memory structure; and
the first set of the groups of memory cells are positioned at one or more outer portions of the memory structure between the interior portion of the memory structure and at least one of the edges of the memory structure.

14. The method of claim 11, wherein the applying the series of erase voltage pulses comprises:
applying erase voltage pulses that increase in magnitude by a first voltage until determining that the first set of the groups of memory cells has completed erasing;
applying a next erase voltage pulse after determining that the first set of the groups of memory cells has completed erasing, the next voltage pulse has an increase in magnitude from a previous erase voltage pulse by a second voltage, the second voltage is greater than the first voltage; and
after the next erase voltage pulse, applying erase voltage pulses that increase in magnitude by the first voltage until the second set of the groups of memory cells has completed erasing.

15. The method of claim 11, wherein skipping erase verify for at least a subset of the second set of groups of memory cells for respective predetermined amounts of additional erase voltage pulses after determining that the first set of the groups of memory cells has completed erasing comprises:
skipping different predetermined amounts of additional erase voltage pulses for different groups of memory cells of the second set of groups of memory cells, indications of the different predetermined amounts of additional erase voltage pulses are stored prior to applying the series of erase voltage pulses.

16. The method of claim 11, wherein:
the groups of memory cells are vertical NAND strings of a three dimensional memory structure.

17. The method of claim 16, wherein:
the three dimensional memory structure is divided into blocks of memory cells;
each of the blocks of memory cells are divided into sub-blocks; and
the vertical NAND strings are in different sub-blocks of a first block.

18. The method of claim 17, wherein:
the second set of the groups of memory cells are positioned at an interior sub-block of the first block; and
the first set of the groups of memory cells are positioned at an outer sub-block of the first block.

19. A method for erasing non-volatile storage, comprising:
applying a series of erase voltage pulses to vertical NAND strings in outer sub-blocks and inner sub-blocks of a selected block;
performing erase verify between erase voltage pulses for vertical NAND strings in the outer sub-blocks of the selected block while skipping erase verify for vertical NAND strings in the inner sub-blocks of the selected block; and
starting to perform erase verify between erase voltage pulses for vertical NAND strings in the inner sub-blocks of the selected block at a predetermined number of erase voltage pulses after the vertical NAND strings in the outer sub-blocks of the selected block successfully erase verify.

20. The method of claim 19, further comprising:
increasing an increment of magnitude of the erase voltage pulses for the erase voltage pulse immediately after the vertical NAND strings in the outer sub-blocks of the selected block successfully erase verify.

* * * * *